US012770700B2

(12) United States Patent
Kim

(10) Patent No.: US 12,770,700 B2
(45) **Date of Patent: *Oct. 20, 2026**

(54) MEMORY DEVICE AND METHOD OF OPERATING THE SAME

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 132 days.

This patent is subject to a terminal disclaimer.

(21) Appl. No.: 18/786,146

(22) Filed: Jul. 26, 2024

(65) Prior Publication Data

US 2024/0386975 A1 Nov. 21, 2024

Related U.S. Application Data

(63) Continuation of application No. 17/862,697, filed on Jul. 12, 2022, now Pat. No. 12,087,376.

(30) Foreign Application Priority Data

Feb. 10, 2022 (KR) ........................ 10-2022-0017787

(51) Int. Cl.
*G11C 16/34* (2006.01)
*G11C 16/04* (2006.01)
(Continued)

(52) U.S. Cl.
CPC ...... *G11C 16/3477* (2013.01); *G11C 16/0483* (2013.01); *G11C 16/08* (2013.01);
(Continued)

(58) Field of Classification Search
CPC . G11C 16/3477; G11C 16/0483; G11C 16/08; G11C 16/10; G11C 16/34; G11C 16/3418; G11C 16/3445
See application file for complete search history.

(56) References Cited

U.S. PATENT DOCUMENTS 2,015,011 A * 9/1935 Haddock .................. C09B 1/50
544/52
9,196,365 B2 * 11/2015 Park .................. G11C 16/0483
(Continued)

FOREIGN PATENT DOCUMENTS

CN 110780802 A 2/2020
CN 111681699 A 9/2020
(Continued)

*Primary Examiner* — Mushfique Siddique
(74) *Attorney, Agent, or Firm* — WILLIAM PARK AND ASSOCIATES LTD.

(57) ABSTRACT

The present technology relates to an electronic device. According to an embodiment of the present disclosure, a memory device may include a plurality of memory cells connected to each word line, a peripheral circuit configured to perform a program operation on memory cells that are connected to a selected word line, and a control logic configured to control the peripheral circuit to perform the program operation on the memory cells that are connected to the selected word line after performing a pre-program operation that increases a threshold voltage of over-erasure cells, among memory cells that are connected to an adjacent word line, having a threshold voltage of an over-erasure state that is lower than a threshold voltage of an erasure state, to the threshold voltage of the erasure state, wherein the adjacent word line is a word line that is next to the selected word line.

13 Claims, 20 Drawing Sheets

(51) Int. Cl.
*G11C 16/08* (2006.01)
*G11C 16/10* (2006.01)

(52) U.S. Cl.
CPC ............ *G11C 16/10* (2013.01); *G11C 16/102* (2013.01); *G11C 16/34* (2013.01); *G11C 16/3418* (2013.01); *G11C 16/3445* (2013.01)

(56) References Cited

U.S. PATENT DOCUMENTS

| | | | | |
|---|---|---|---|---|
| 9,424,935 | B2 * | 8/2016 | Shim ...................... | G11C 16/26 |
| 9,767,910 | B1 * | 9/2017 | Bushnaq ................ | G11C 16/32 |
| 9,916,900 | B2 * | 3/2018 | Kim ..................... | G11C 16/107 |
| 2008/0205147 | A1 * | 8/2008 | Santin ................ | G11C 16/3418<br>365/185.01 |
| 2012/0327718 | A1 * | 12/2012 | Lee .................... | G11C 16/0483<br>365/185.2 |
| 2015/0364185 | A1 | 12/2015 | Yoo | |
| 2019/0057744 | A1 * | 2/2019 | Lee ........................ | G11C 16/10 |
| 2020/0020403 | A1 | 1/2020 | Lee et al. | |
| 2020/0043556 | A1 * | 2/2020 | Moon ................... | G06F 3/0652 |
| 2020/0098432 | A1 | 3/2020 | Shirakawa et al. | |
| 2022/0020441 | A1 | 1/2022 | Hwang | |

FOREIGN PATENT DOCUMENTS

| | | | |
|---|---|---|---|
| KR | 1020150142503 | A | 12/2015 |
| KR | 1020190020880 | A | 3/2019 |
| KR | 1020200014136 | A | 2/2020 |

* cited by examiner

MEMORY DEVICE AND METHOD OF OPERATING THE SAME

CROSS-REFERENCE TO RELATED APPLICATION

The present application is a continuation application of U.S. patent application Ser. No. 17/862,697, filed on Jul. 12, 2022, which claims priority under 35 U.S.C. § 119 (a) to Korean patent application number 10-2022-0017787 filed on Feb. 10, 2022, in the Korean Intellectual Property Office, the entire contents of which applications are incorporated herein by reference.

BACKGROUND

1. Technical Field

The present disclosure relates to an electronic device, and more particularly, to a memory device and a method of operating the same.

2. Related Art

A storage device is a device that stores data under control of a host device, such as a computer or a smartphone. A storage device may include a memory device in which data is stored and a memory controller controlling the memory device. The memory device is divided into a volatile memory device and a nonvolatile memory device.

The volatile memory device is a device that stores data only when power is supplied and loses the stored data when the power supply is cut off. The volatile memory device includes a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

According to an embodiment of the present disclosure, a memory device may include a plurality of memory cells connected to each word line, among a plurality of word lines, a peripheral circuit configured to perform a program operation on memory cells that are connected to a selected word line among the plurality of word lines, and a control logic configured to control the peripheral circuit to perform the program operation on the memory cells that are connected to the selected word line after performing a pre-program operation that increases a threshold voltage of over-erasure cells, among memory cells that are connected to an adjacent word line, having a threshold voltage of an over-erasure state that is lower than a threshold voltage of an erasure state, to the threshold voltage of the erasure state, wherein the adjacent word line is a word line that is next to the selected word line.

According to an embodiment of the present disclosure, a memory device may include a plurality of memory cells that are connected to each word line, among a plurality of word lines, a peripheral circuit configured to perform a program operation on memory cells that are connected to a selected word line among the plurality of word lines, and a control logic configured to control the peripheral circuit to perform the program operation on the memory cells that are connected to the selected word line after performing a pre-program operation that programs a threshold voltage of over-erasure cells, among memory cells that are connected to an adjacent word line, having a threshold voltage of an over-erasure state that is lower than a threshold voltage of an erasure state, to the threshold voltage of the erasure state, wherein the adjacent word line is a word line that is next to the selected word line.

According to an embodiment of the present disclosure, a method of operating a memory device including a plurality of memory cells that are connected to each word line, among a plurality of word lines, and performing a program operation on memory cells that are connected to selected word lines, among the plurality of word lines may include determining over-erasure cells, among memory cells that are connected to an adjacent word line, having a threshold voltage of an over-erasure state that is lower than a threshold voltage of an erasure state, wherein the adjacent word line is a word line that is next to the selected word line, performing a pre-program operation that programs the over-erasure cells to the erasure state, and performing a program operation on the memory cells that are connected to the selected word line.

DETAILED DESCRIPTION

Specific structural or functional descriptions of embodiments according to the concept, which are disclosed in the present disclosure, are illustrated only to describe the embodiments according to the concepts of the present disclosure. The embodiments, according to the concepts of the present disclosure, may be carried out in various forms and should not be construed as being limited to the embodiments described in the present disclosure.

Hereinafter, the present disclosure is described in detail by describing preferred embodiments of the present disclosure with reference to the accompanying drawings. Hereinafter, an embodiment of the present disclosure is described in detail with reference to the accompanying drawings.

An embodiment of the present disclosure provides a memory device in which a threshold voltage distribution deterioration phenomenon of memory cells due to an interference phenomenon between adjacent word lines during a program operation of the memory device is improved.

According to the present technology, a memory device, in which a threshold voltage distribution deterioration phenomenon of memory cells due to an interference phenomenon between adjacent word lines during a program operation of the memory device is improved, is provided.

Figure 1:
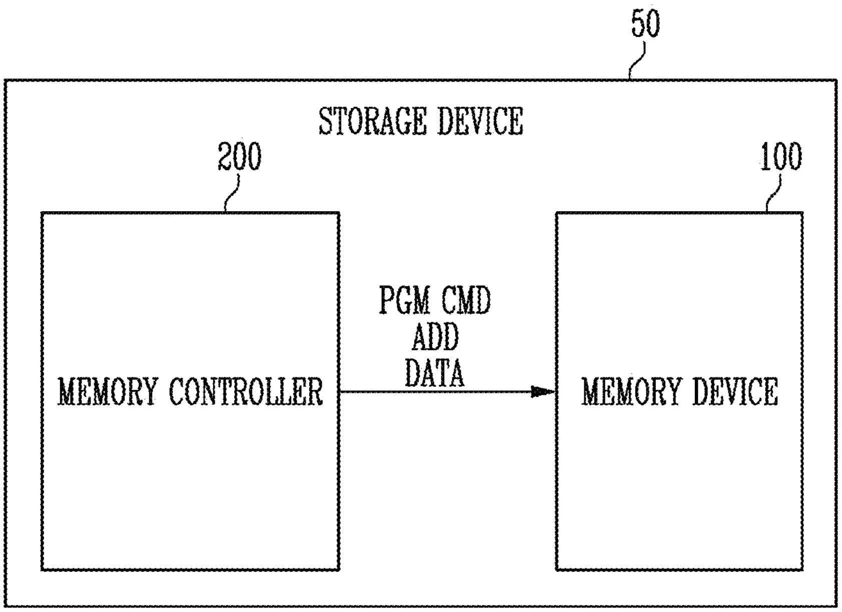
FIG. 1 is a diagram illustrating a storage device according to an embodiment.

FIG. 1 is a diagram illustrating a storage device according to an embodiment.

Referring to FIG. 1, a storage device 50 may include a memory device 100 and a memory controller 200 that controls an operation of the memory device 100. The storage device 50 may be a device that stores data under the control of a host, such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host. For example, the storage device 50 may be configured as any one of various types of storage devices, such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multichip package (MCP), a chip on board (COB), a wafer-level fabricated package (WFP), and a wafer-level stack package (WSP).

The memory device 100 may store data. The memory device 100 may operate under the control of the memory controller 200. The memory device 100 may include a memory cell array including a plurality of memory cells that store data. The memory cell array may include a plurality of memory blocks. Each memory block may include a plurality of memory cells. One memory block may include a plurality of pages. In an embodiment, the page may be a unit for storing data in the memory device 100 or reading data that is stored in the memory device 100. The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present disclosure, for convenience of description, it is assumed that the memory device 100 is a NAND flash memory.

The memory device 100 may be configured to receive a command and an address from the memory controller 200 and may access an area that is selected by the address of the memory cell array. That is, the memory device 100 may perform an operation that is the command on the area that is selected by the address. For example, the memory device 100 may perform a write operation (program operation), a read operation, and an erase operation. During the program operation, the memory device 100 may program data to the area that is selected by the address. During the read operation, the memory device 100 may read data from the area that is selected by the address. During the erase operation, the memory device 100 may erase data that is stored in the area that is selected by the address.

In an embodiment, the memory device 100 may receive a program command PGM CMD, data DATA, and an address ADD from the memory controller 200. The memory device 100 may program the data DATA in an area that is selected by the address ADD that is received from the memory controller 200 in response to the program command PGM CMD received from the memory controller 200. Before performing the program operation on the memory cells that are connected to the selected word line, the memory device 100 may perform a pre-program operation on memory cells that are connected to an adjacent word line that is adjacent to the selected word line. The pre-program operation may be an operation that increases a threshold voltage of memory cells, having a threshold voltage of an over-erasure state, to a threshold voltage of an erasure state.

The memory controller 200 may control the overall operation of the storage device 50.

When power is applied to the storage device 50, the memory controller 200 may execute firmware (FW). When the memory device 100 is a flash memory device, the memory controller 200 may operate firmware, such as a flash translation layer (FTL) for controlling communication between the host and the memory device 100.

In an embodiment, the memory controller 200 may receive data and a logical block address (LBA) from the host and convert the LBA into a physical block address (PBA) that indicates an address of memory cells in which data that is included in the memory device 100 is to be stored.

The memory controller 200 may control the memory device 100 to perform the program operation, the read operation, or the erase operation in response to a request of the host. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may generate and transmit the program command, the address, and the data to the memory device 100 without the request from the host. For example, the memory controller 200 may provide the command, the address, and the data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 through an interleaving method to improve operation performance.

The host may communicate with the storage device 50 using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Figure 2:
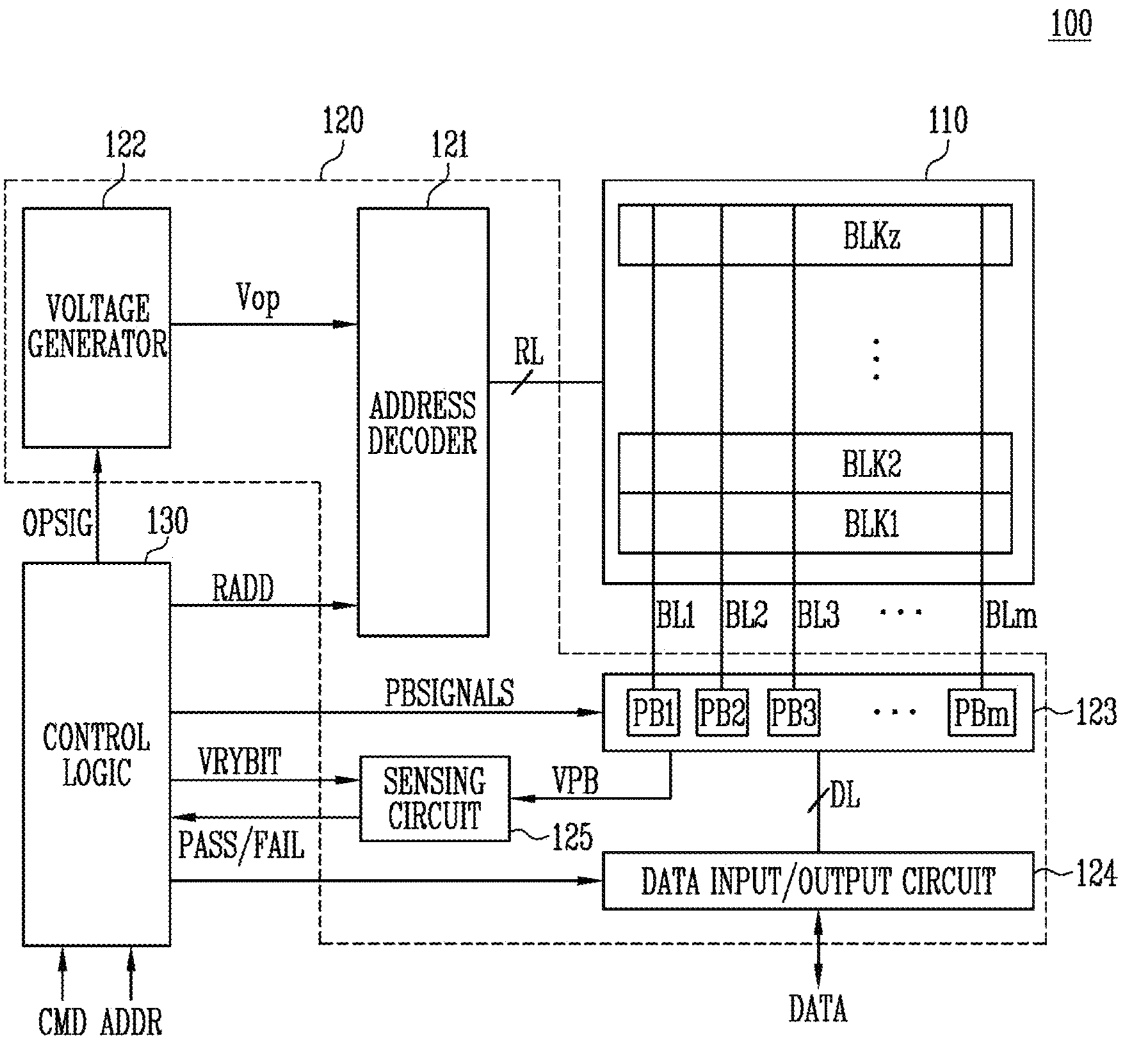
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a read and write circuit 123 through bit lines BL1 to BLm. Each of the plurality of memory blocks BLK1 to BLKz may include a plurality of memory cells. As an embodiment, the plurality of memory cells may be nonvolatile memory cells. Memory cells, among the plurality of memory cells, connected to the same word line, may be defined as one physical page. That is, the memory cell array 110 may be configured of a plurality of pages.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include an address decoder 121, a voltage generator 122, the read and write circuit 123, and a data input/output circuit 124.

The peripheral circuit 120 may drive the memory cell array 110. For example, the peripheral circuit 120 may drive the memory cell array 110 to perform a program operation, a read operation, and an erase operation.

The address decoder 121 may be connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 may be configured to operate in response to the control of the control logic 130. The address decoder 121 may receive an address RADD from the control logic 130.

The address decoder 121 may be configured to decode a block address of the received address RADD. The address decoder 121 may select at least one memory block, among the memory blocks BLK1 to BLKz, according to the decoded block address. The address decoder 121 may be configured to decode a row address of the received address RADD. The address decoder 121 may select at least one word line of a selected memory block by applying voltages that are provided from the voltage generator 122 to at least one word line.

During the program operation, the address decoder 121 may apply a program voltage to a selected word line and may apply a pass voltage having a lower voltage level than the program voltage to unselected word lines. During a program verify operation, the address decoder 121 may apply a verify voltage to the selected word line and may apply a verify pass voltage having a higher voltage level than the verify voltage to the unselected word lines.

During the read operation, the address decoder 121 may apply a read voltage to the selected word line and apply a read pass voltage having a higher voltage than the read voltage to the unselected word lines.

According to an embodiment of the present disclosure, the erase operation of the memory device 100 may be performed in a memory block unit. The address ADDR that is input to the memory device 100 during the erase operation may include a block address. The address decoder 121 may decode the block address and select one memory block according to the decoded block address. During the erase operation, the address decoder 121 may apply a ground voltage to the word lines that are connected to the selected memory block.

The voltage generator 122 may be configured to generate a plurality of voltages by using an external power voltage that is supplied to the memory device 100. The voltage generator 122 may operate in response to the control of the control logic 130.

As an embodiment, the voltage generator 122 may generate an internal power voltage by regulating the external power voltage. The internal power voltage that is generated by the voltage generator 122 may be used as an operation voltage of the memory device 100.

As an embodiment, the voltage generator 122 may generate the plurality voltages by using the external power voltage or the internal power voltage. The voltage generator 122 may be configured to generate various voltages that are required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of voltages having various voltage levels, the voltage generator 122 may include a plurality of pumping capacitors that receive the internal voltage and selectively activate the plurality of pumping capacitors in response to the control of the control logic 130 to generate the plurality of voltages.

The plurality of generated voltages may be supplied to the memory cell array 110 by the address decoder 121.

The read and write circuit 123 may include first to m-th page buffers PB1 to PBm. The first to m-th page buffers PB1 to PBm may be connected to the memory cell array 110 through first to m-th bit lines BL1 to BLm, respectively. The first to m-th page buffers PB1 to PBm may operate in response to the control of the control logic 130.

The first to m-th page buffers PB1 to PBm may output and receive data DATA to and from the data input/output circuit 124. During a program operation, the first to m-th page buffers PB1 to PBm may receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA that is received through the data input/output circuit 124, to the selected memory cells through the bit lines BL1 to BLm. The memory cells of the selected page may be programmed according to the transferred data DATA. A memory cell that is connected to a bit line to which a program allowable voltage (for example, a ground voltage) is applied may have an increased threshold voltage. The threshold voltage of a memory cell that is connected to a bit line to which a program inhibition voltage (for example, a power voltage) is applied may be maintained. During the program verify operation, the first to m-th page buffers PB1 to PBm may read the data DATA that is stored in the memory cells from the selected memory cells through the bit lines BL1 to BLm.

During the read operation, the read and write circuit 123 may read the data DATA from the memory cells of the selected page through the bit lines BL1 to BLm and may store the read data DATA in the first to m-th page buffers PB1 to PBm.

During the erase operation, the read and write circuit 123 may float the bit lines BL1 to BLm. As an embodiment, the read and write circuit 123 may include a column select circuit.

The data input/output circuit 124 may be connected to the first to m-th page buffers PB1 to PBm through the data lines DL. The data input/output circuit 124 may operate in response to the control of the control logic 130.

The data input/output circuit 124 may include a plurality of input/output buffers (not shown) that receive data DATA. During the program operation, the data input/output circuit 124 may receive the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, a sensing circuit 125 may generate a reference current in response to a signal of an allowable bit VRYBIT that is generated by the control logic 130 and may compare a sensing voltage VPB that is received from the read and write circuit 123 with a reference voltage that is generated by the reference current to output a pass signal PASS or a fail signal FAIL to the control logic 130.

In an embodiment, the sensing circuit 125 may include a current sensing circuit that counts the number of fail bits, which is the number of program-failed cells, among the target cells.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD that is transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the allowable bit VRYBIT in response to the command CMD and the address ADDR. The control logic 130 may output the operation signal OPSIG to the voltage generator 122, output the row address RADD to the address decoder 121, output the read and write circuit control signal PBSIGNALS to the read and write circuit 123, and output the allowable bit VRYBIT to the sensing circuit 125. In addition, the control logic 130 may determine whether the verify operation passes or fails in response to the pass signal PASS or the fail signal FAIL that is output by the sensing circuit 125.

In an embodiment, the control logic 130 may receive the program command from the memory controller. The control logic 130 may control the peripheral circuit 120 so that the memory device 100 performs the program operation on the memory cells that are connected to the selected word line in response to the program command that is received from the memory controller. The control logic 130 may perform the pre-program operation on the memory cells that are connected to the adjacent word line before performing the program operation on the memory cells that are connected to the selected word line. The adjacent word line may mean a word line that is next to the selected word line. The pre-program operation may be an operation that increases the threshold voltage of the memory cells, among the memory cells that are connected to the adjacent word line, having the threshold voltage of the over-erasure state, to the threshold voltage of the erasure state. The threshold voltage of the over-erasure state may be lower than the threshold voltage of the erasure state.

Figure 3:
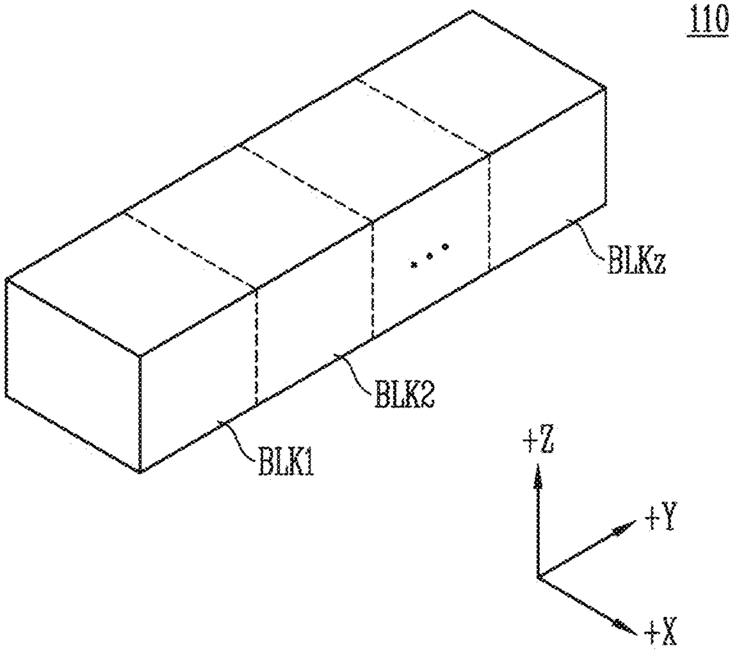
FIG. 3 (Prior Art)
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate. Such plurality of memory cells may be arranged along a +X direction, a +Y direction, and a +Z direction. A structure of each memory block is described in more detail with reference to FIG. 4.

Figure 4:
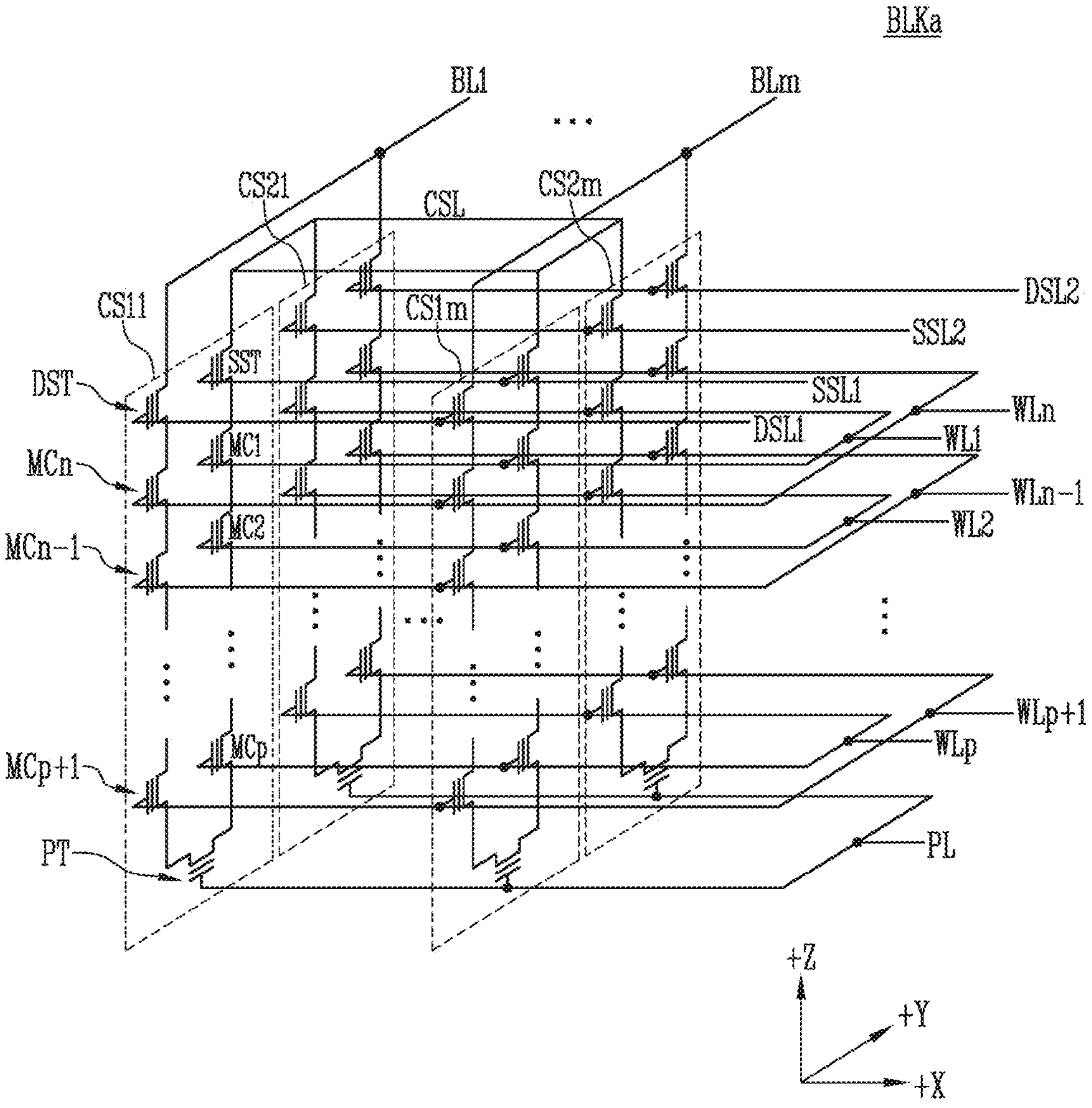
FIG. 4 (Prior Art)
FIG. 4 is a circuit diagram illustrating any one memory block BLKa among memory blocks BLK1 to BLKz of FIG. 2.

FIG. 4 is a circuit diagram illustrating any one memory block BLKa among the memory blocks BLK1 to BLKz of FIG. 2.

Referring to FIG. 4, the memory block BLKa may include a plurality of cell strings CS11 to CS1*m* and CS21 to CS2*m*. As an embodiment, each of the plurality of cell strings CS11 to CS1*m* and CS21 to CS2*m* may be formed in a 'U' shape. In the memory block BLKa, m cell strings may be arranged in a row direction (that is, the +X direction). In FIG. 4, two cell strings may be arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* may include at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string may be connected between a common source line CSL and the memory cells MC1 to MCp.

As an embodiment, the source select transistors of the cell strings that are arranged in the same row may be connected to a source select line, extending in the row direction, and the source select transistors of the cell strings that are arranged in different rows may be connected to different source select lines. In FIG. 4, the source select transistors of the cell strings CS11 to CS1*m* of a first row may be connected to a first source select line SSL1. The source select transistors of the cell strings CS21 to CS2*m* of a second row may be connected to a second source select line SSL2.

As another embodiment, the source select transistors of the cell strings CS11 to CS1*m* and CS21 to CS2*m* may be commonly connected to one source select line.

The first to n-th memory cells MC1 to MCn of each cell string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a direction opposite to the +Z direction and may be connected in series between the source select transistor SST and the pipe transistor PT. The (p+1)-th to n-th memory cells MCp+1 to MCn may be sequentially arranged in the +Z direction and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each cell string may be connected to the first to n-th word lines WL1 to WLn, respectively.

A gate of the pipe transistor PT of each cell string may be connected to a pipeline PL.

The drain select transistor DST of each cell string may be connected between a corresponding bit line and the memory cells MCp+1 to MCn. The cell strings that are arranged in the row direction may be connected to the drain select line that extends in the row direction. The drain select transistors of the cell strings CS11 to CS1*m* of the first row may be connected to a first drain select line DSL1. The drain select transistors of the cell strings CS21 to CS2*m* of the second row may be connected to a second drain select line DSL2.

The cell strings that are arranged in the column direction may be connected to the bit lines extending in the column direction. In FIG. 4, the cell strings CS11 and CS21 of the first column may be connected to the first bit line BL1. The cell strings CS1*m* and CS2*m* of the m-th column may be connected to the m-th bit line BLm.

The memory cells that are connected to the same word line in the cell strings that are arranged in the row direction may configure one page. For example, the memory cells, among the cell strings CS11 to CS1*m* of the first row, connected to the first word line WL1, may configure one page. The memory cells, among the cell strings CS21 to CS2*m* of the second row, connected to the first word line WL1, may configure another page. The cell strings that are arranged in one row direction may be selected by selecting any one of the drain select lines DSL1 and DSL2. One page of the selected cell strings may be selected by selecting any one of the word lines WL1 to WLn.

Figure 5:
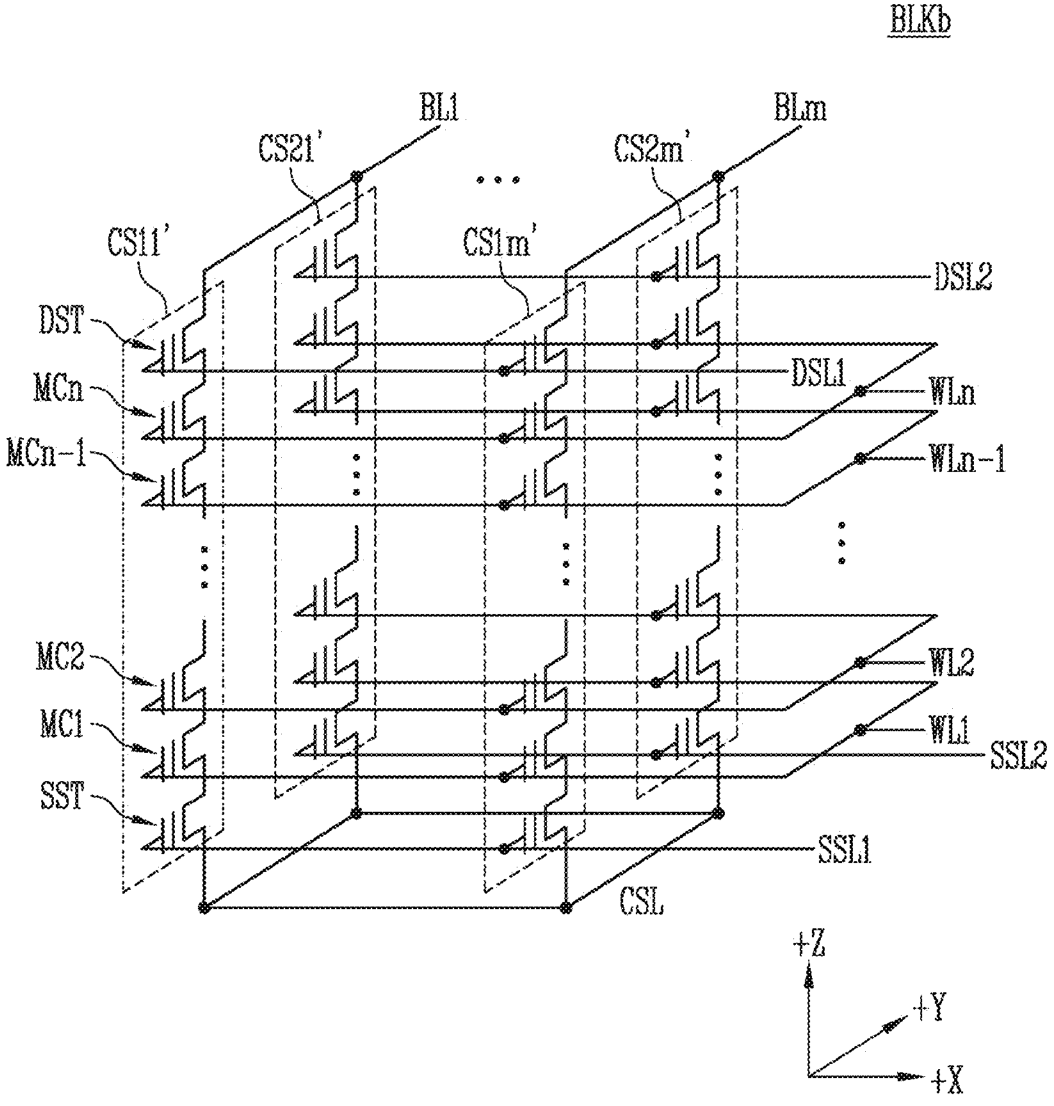
FIG. 5 (Prior Art)
FIG. 5 is a circuit diagram illustrating another embodiment of any one memory block BLKb among the memory blocks BLK1 to BLKz of FIG. 2.

FIG. 5 is a circuit diagram illustrating another embodiment of any one memory block BLKb, among the memory blocks BLK1 to BLKz of FIG. 2.

As another embodiment, even bit lines and odd bit lines may be provided, instead of the first to m-th bit lines BL1 to BLm. In addition, even-numbered cell strings, among the cell strings CS11 to CS1*m* or CS21 to CS2*m* that are arranged in the row direction, may be connected to the even bit lines, and odd-numbered cell strings, among the cell strings CS11 to CS1*m* or CS21 to CS2*m* that are arranged in the row direction, may be connected to odd bit lines, respectively.

As an embodiment, at least one of the first to n-th memory cells MC1 to MCn may be used as a dummy memory cell. For example, at least one dummy memory cell may be provided to reduce an electric field between the source select transistor SST and the memory cells MC1 to MCp. Alternatively, at least one dummy memory cell may be provided to reduce an electric field between the drain select transistor DST and the memory cells MCp+1 to MCn. As more dummy memory cells are provided, reliability of an operation on the memory block BLKb may be improved; however, the size of the memory block BLKb may increase. As less memory cells are provided, the size of the memory block BLKb may be reduced; however, the reliability of the operation on the memory block BLKb may be reduced.

In order to efficiently control at least one dummy memory cell, each of the dummy memory cells may have a required threshold voltage. Before or after an erase operation on the memory block BLKb, program operations for all or a part of the dummy memory cells may be performed. When the erase operation is performed after the program operation is performed, the dummy memory cells may have the required threshold voltage by controlling a voltage that is applied to the dummy word lines that are connected to the respective dummy memory cells.

Figure 6:
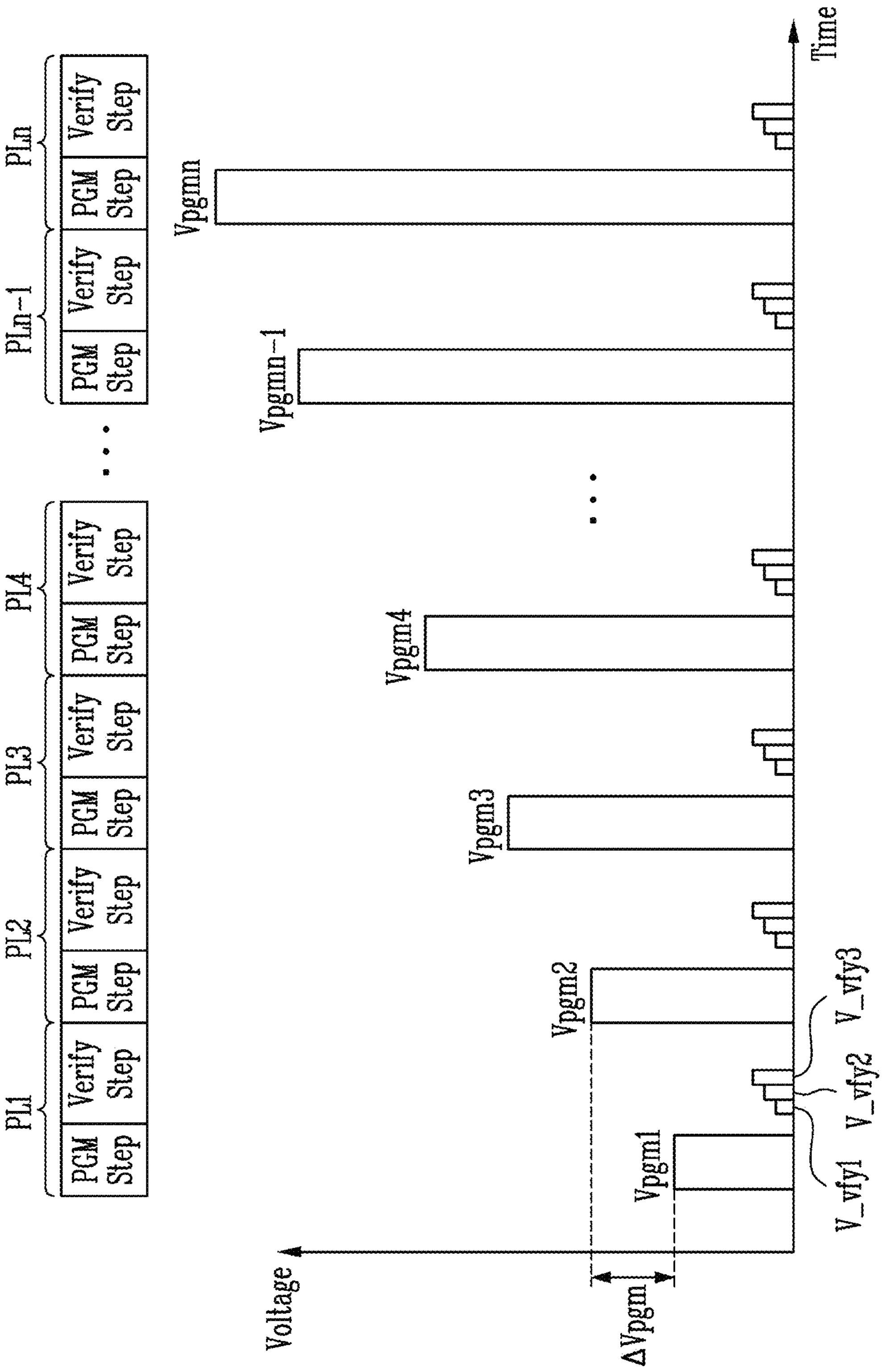
FIG. 6 is a diagram illustrating a program operation according to an embodiment.

FIG. 6 is a diagram illustrating a program operation according to an embodiment.

Referring to FIG. 6, the program operation may include a plurality of program loops PL1 to PLn. The memory device may perform the plurality of program loops PL1 to PLn to program the selected memory cells to have any one program state among a plurality of program states.

Each of the plurality of program loops PL1 to PLn may include a program voltage apply step PGM Step of applying the program voltage and a verify step Verify Step of determining whether the memory cells are programmed by applying verify voltages.

In the program voltage apply step, a program voltage apply operation of applying the program voltage to the selected word line that is connected to the selected memory cells may be performed. The selected memory cells may be programmed to any one program state, among first to n-th (n is a natural number) state, by the program voltage apply operation.

In an embodiment, the program voltage may be determined according to an incremental step pulse programming (ISPP) method. That is, a level of the program voltage may increase or decrease, stepwise, by a step voltage as the program loops are repeated. The application number, a voltage level, a voltage application time, and the like of the program voltages that are used in each program loop may be determined in various forms according to control of the memory controller.

The pass voltage may be applied to the unselected word lines that are word lines other than the selected word line. In an embodiment, pass voltages having the same level may be applied to the unselected word lines. In an embodiment, the pass voltage may have different levels according to a position of the word line.

A ground voltage may be applied as the program allowable voltage to the selected bit lines that are connected to the memory cell to be programmed. The program inhibition voltage may be applied to unselected bit lines. The unselected bit lines may be bit lines that are connected to unselected memory cells, memory cells besides the memory cells to be programmed.

In the program verify step, the memory device may apply the verify voltage to the selected word line and may apply the verify pass voltage to the unselected word lines. The memory device may sense a voltage or a current that is output through the bit lines to which the memory cells that are connected to the selected word line are respectively connected and may determine whether the verify step passes or fails based on a sensed result.

In the verify step, the program verify operation may be performed on at least one program state, among the first to n-th program states. For example, when memory cells to be programmed to a k-th (k is a natural number equal to or greater than 1 and equal to or less than n) state are read as off-cells by the verify voltage, corresponding to the k-th state, the program verify operation on the k-th state may be passed.

In FIG. 6, when the selected memory cells are MLCs that store two data bits, the selected memory cells may be programmed to any one program state, among an erasure state and first to third program states. The number of data bits that are stored in the memory cell is not limited to the present embodiment.

When the first program loop PL1 is performed, after a first program voltage Vpgm1 is applied, first to third verify voltages V_vfy1 to V_vfy3 may be sequentially applied to verify the program state of the plurality of memory cells. At this time, memory cells of which a target state is a first program state may be verified by the first verify voltage V_vfy1, memory cells of which a target state is a second program state may be verified by the second verify voltage V_vfy2, and memory cells of which a target state is a third program state may be verified by the third verify voltage V_vfy3. The number of verify voltages is not limited to the present embodiment.

The memory cells of which the verification is passed through each of the verify voltages V_vfy1 to V_vfy3 may be determined to have the target state and then may be program-inhibited in a second program loop PL2. The program inhibition voltage may be applied to a bit line that is connected to the program-inhibited memory cells. A second program voltage Vpgm2 having a higher voltage level than the first program voltage Vpgm1 by a unit voltage ΔVpgm may be applied to the selected word line in the second program loop PL2.

Thereafter, the verify operation may be performed identically to the verify operation of the first program loop PL1. Exemplarily, a verify pass may indicate that a memory cell is read as an off-cell by a corresponding verify voltage.

As described above, when the memory device programs the MLC, the memory device may verify the memory cells having the respective program states as the target states by using the first to third verify voltages V_vfy1 to V_vfy3.

Figure 7:
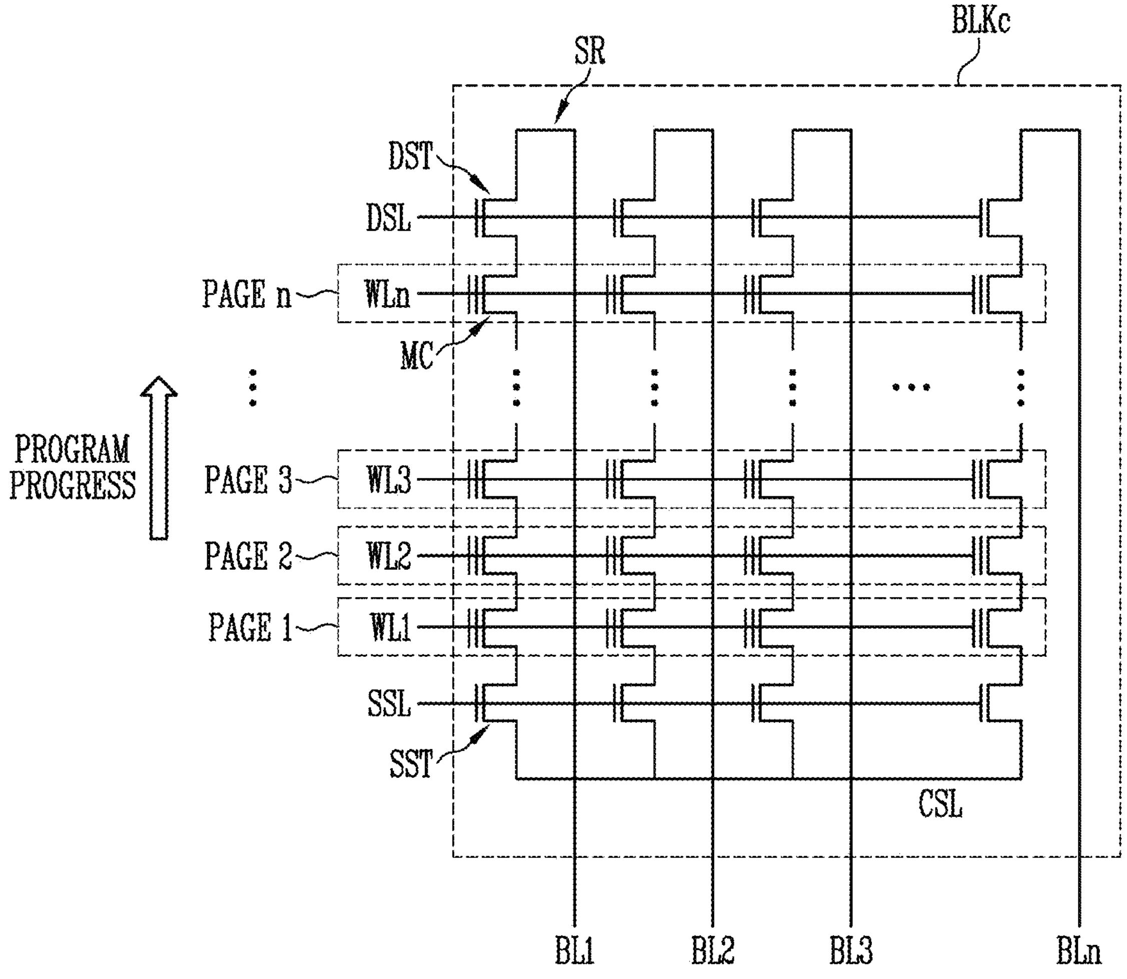
FIG. 7 is a circuit diagram illustrating another embodiment of any one memory block BLKc among the memory blocks BLK1 to BLKz of FIG. 2.

FIG. 7 is a circuit diagram illustrating another embodiment of any one memory block BLKc, among the memory blocks BLK1 to BLKz of FIG. 2.

Referring to FIG. 7, the memory block BLKc may include a plurality of strings SR. The plurality of strings SR may be connected to a plurality of bit lines BL1 to BLn, respectively. Each string SR may include a source select transistor SST, memory cells MC, and a drain select transistor DST. The source select transistor SST of each string SR may be connected between the memory cells MC and the common source line CSL. The source select transistors SST of the plurality of strings SR may be commonly connected to the common source line CSL. The drain select transistor DST of each string SR may be connected between the memory cells MC and the bit line BL. The drain select transistors DST of the plurality of strings SR may be connected to the plurality of bit lines BL1 to BLn, respectively. In each string SR, the plurality of memory cells MC may be provided between the source select transistor SST and the drain select transistor DST. In each string SR, the plurality of memory cells MC may be connected in series.

In the plurality of strings SR, the memory cells MC that are positioned in the same order from the common source line CSL may be commonly connected to one word line. The memory cells MC of the plurality of strings SR may be connected to the plurality of word lines WL1 to WLn.

Memory cells that are connected to the same word line in the plurality of strings SR that are arranged in a row direction may configure one page PAGE. For example, in the plurality of strings SR, memory cells that are connected to a first word line WL1 may configure a first page PAGE 1. Memory cells that are connected to a second word line WL2 may configure a second page PAGE 2. Memory cells that are connected to a third word line WL3 may configure a third page PAGE 3. Memory cells that are connected to an n-th word line WLn may configure an n-th page PAGE n.

The memory device may perform the program operation on the selected memory cells in response to the program command that is provided from the memory controller. The program operation may be performed in a page unit corresponding to each of the word lines WL1 to WLn.

In an embodiment, the program operation corresponding to the program command of the memory controller may be sequentially performed on a plurality of pages based on the physical position of a word line corresponding to each page. For example, the memory controller may select a first page PAGE 1 to an n-th page PAGE n as program target pages. The memory controller may control the memory device so that the program operation is sequentially performed from the first page PAGE 1 to the n-th page PAGE n.

The order of the program operations on the plurality of pages is not limited by the present embodiment, and the memory controller may control the memory device so that the program operation is sequentially performed from the n-th page PAGE n to the first page PAGE 1.

Figure 8:
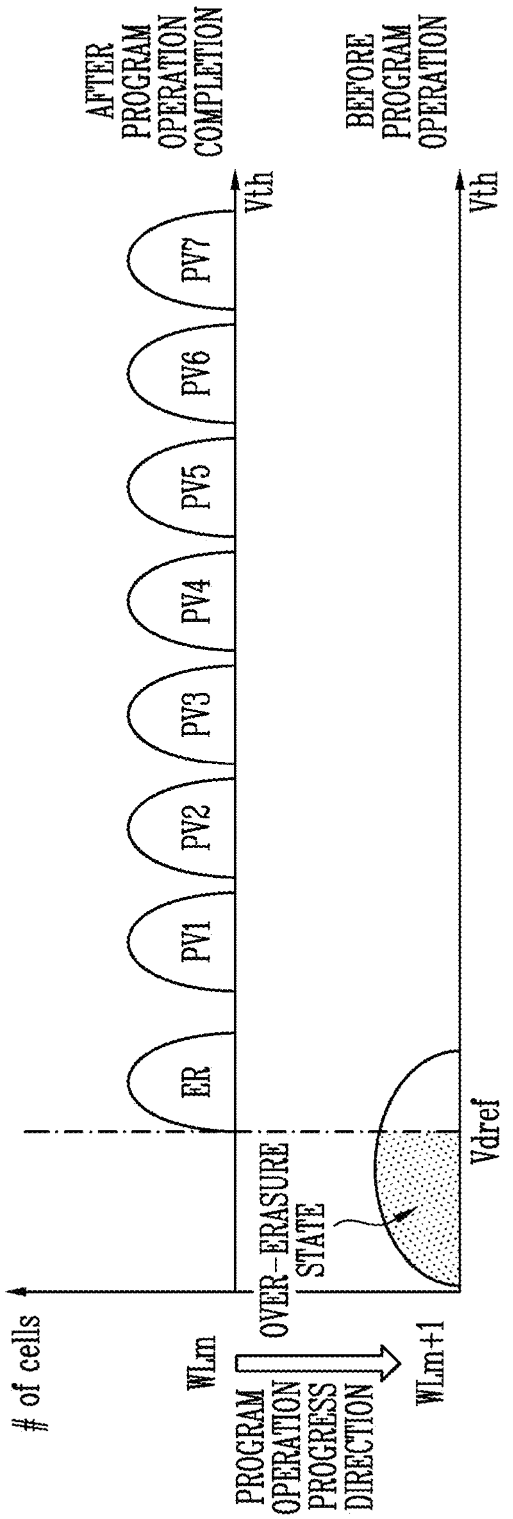
FIG. 8 is a diagram illustrating a threshold voltage distribution of memory cells before a program operation is performed on an adjacent word line after the program operation on memory cells that are connected to a selected word line is completed.

FIG. 8 is a diagram illustrating a threshold voltage distribution of the memory cells before the program operation is performed on the adjacent word line after the program operation on the memory cells that are connected to the selected word line is completed.

Referring to FIG. 8, it is assumed that the memory cell is a TLC that stores three data bits. In FIG. 8, an upper portion of the graph illustrates a threshold voltage distribution of memory cells that are connected to an m-th word line Wm after a program operation on the memory cells that are connected to the m-th word line Wm, among the plurality of word lines, is completed. A lower portion of the graph illustrates a threshold voltage distribution of memory cells that are connected to an (m+1)-th word line Wm+1 before a program operation is performed on the memory cells that are connected to the (m+1)-th word line Wm+1. In an embodiment, the (m+1)-th word line Wm+1 may be adjacent to the m-th word line Wm and may be a word line on which the program operation is to be performed.

Referring to the upper portion of the graph of FIG. 8, after the program operation on the memory cells that are connected to the m-th word line Wm is completed, the memory cells that are connected to the m-th word line may have a threshold voltage of any one of an erasure state ER and first to seventh program states PV1 to PV7.

Referring to the lower portion of the graph of FIG. 8, since the memory cells, among the memory cells that are connected to the (m+1)-th word line Wm+1, are before the program operation is performed, over-erasure cells may be included. The over-erasure cells may be memory cells having a threshold voltage level that is lower than that of an over-erasure reference voltage Vdref. The over-erasure reference voltage Vdref may be a voltage for distinguishing the erasure state ER and the over-erasure state. A magnitude of the over-erasure reference voltage Vdref may be the same as the lowest threshold voltage, among threshold voltages that are included in the erasure state ER.

When the program operation is performed on the over-erasure cells, a threshold voltage of the memory cells that are connected to the adjacent word line may move. This is described with reference to FIG. 9.

Figure 9:
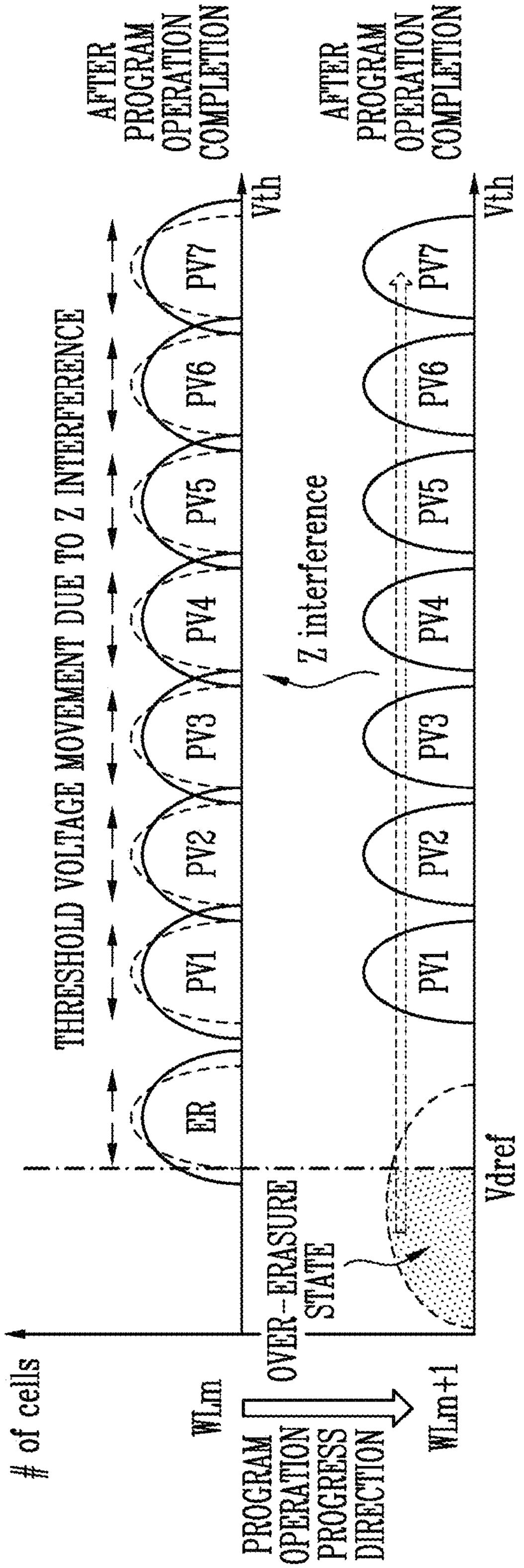
FIG. 9 is a diagram illustrating a threshold voltage distribution of memory cells after the program operation on the adjacent word line is performed after the program operation on the memory cells that are connected to the selected word line is completed.

FIG. 9 is a diagram illustrating a threshold voltage distribution of the memory cells after the program operation on the adjacent word line is performed after the program operation on the memory cells that are connected to the selected word line is completed.

In FIG. 9, the upper portion of the graph illustrates a threshold voltage distribution of the memory cells that are connected to the m-th word line Wm after the program operation on the memory cells that are connected to the (m+1)-th word line Wm+1 is completed. The lower portion of the graph illustrates a threshold voltage distribution of the memory cells that are connected to the (m+1)-th word line Wm+1 after the program operation on the memory cells that are connected to the (m+1)-th word line Wm+1 is completed. In an embodiment, the (m+1)-th word line Wm+1 may be adjacent to the m-th word line Wm and may be a word line on which the program operation is to be performed next to the m-th word line Wm.

Referring to FIGS. 8 and 9, after the program operation on the memory cells that are connected to the m-th word line Wm is completed, the program operation on the memory cells that are connected to the (m+1)-th word line Wm+1 may be performed. The over-erasure cells, among the memory cells that are connected to the (m+1)-th word line Wm+1, may be included. In an embodiment, while the program operation on the over-erasure cells that are connected to the (m+1)-th word line Wm+1 is being performed, Z-interference may occur in the memory cells that are connected to the m-th word line Wm. Specifically, while the program operation on the memory cells that are connected to the (m+1)-th word line Wm+1 is being performed, a threshold voltage of the memory cells that are connected to the m-th word line Wm may move based on the Z interference that occurs in the memory cells that are connected to the m-th word line Wm.

In addition, although not shown in the drawing, when a plurality of over-erasure cells exist among a plurality of memory cells connected to the word line, a charge that is trapped in a charge trap layer of a memory cell that is adjacent to the over-erasure cell may move to a charge trap layer of the over-erasure cell, and thus, a threshold voltage of the adjacent memory cell that is adjacent to the over-erasure cell may move.

Therefore, to decrease the deterioration of the threshold voltage of the memory cells that are connected to the word line that is adjacent to the over-erasure cell caused by the over-erasure cells, an operation that increases the threshold voltage of the over-erasure cells to the threshold voltage of the erasure state may be required to be performed.

Figure 10:
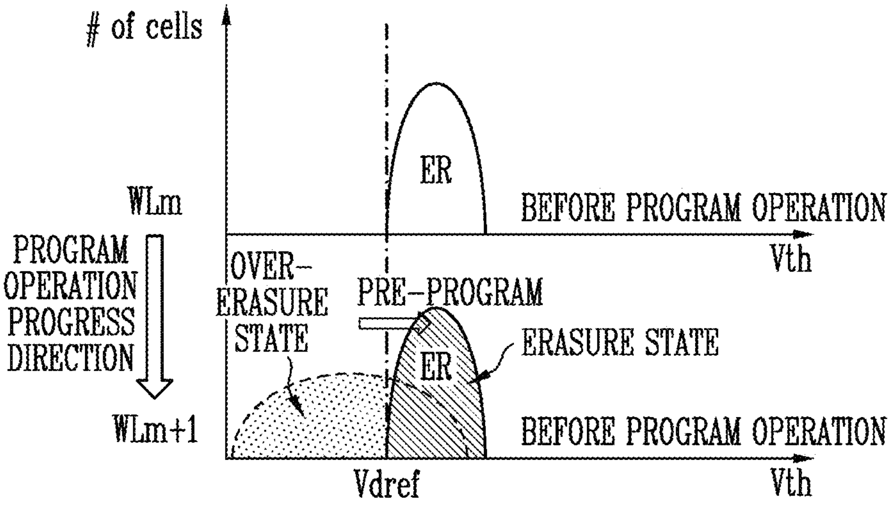
FIG. 10 is a diagram illustrating a pre-program operation on memory cells that are connected to an adjacent word line according to an embodiment.

FIG. 10 is a diagram illustrating a pre-program operation on memory cells that are connected to an adjacent word line according to an embodiment.

In FIG. 10, an upper portion of the graph illustrates the threshold voltage distribution of the memory cells that are connected to the m-th word line Wm before the program operation on the memory cells that are connected to the m-th word line Wm among the plurality of word lines is performed. A lower portion of the graph illustrates the threshold voltage distribution of the memory cells that are connected to the (m+1)-th word line Wm+1 before the program operation on the memory cells that are connected to the (m+1)-th word line Wm+1 is performed. In an embodiment, the (m+1)-th word line Wm+1 may be adjacent to the m-th word line Wm and may be a word line on which the program operation is to be performed next to the m-th word line Wm.

Referring to FIG. 10, the pre-program operation on the memory cells that are connected to the (m+1)-th word line Wm+1 may be performed before the program operation on the memory cells that are connected to the m-th word line Wm is performed. The pre-program operation may be an operation that increases the threshold voltage of the over-erasure cells among the memory cells that are connected to the adjacent word line to the threshold voltage of the erasure state before the program operation is performed on the selected word line. The adjacent word line may be a word line that is adjacent to the selected word line.

In an embodiment, the memory device may perform the pre-program operation to increase the threshold voltage of the over-erasure cells, among the memory cells that are connected to the (m+1)-th word line Wm+1, to the over-erasure reference voltage Vdref or higher before performing the program operation on the memory cells that are connected to the m-th word line Wm. The magnitude of the over-erasure reference voltage Vdref may be the same as the lowest threshold voltage, among the threshold voltages that are included in the erasure state ER.

As described with reference to FIG. 10, by performing the pre-program operation that is performed on the memory cells that are connected to the adjacent word line before performing the program operation on the memory cells that are connected to the selected word line, the threshold voltage deterioration phenomenon due to the over-erasure cells may be improved.

Figure 11:
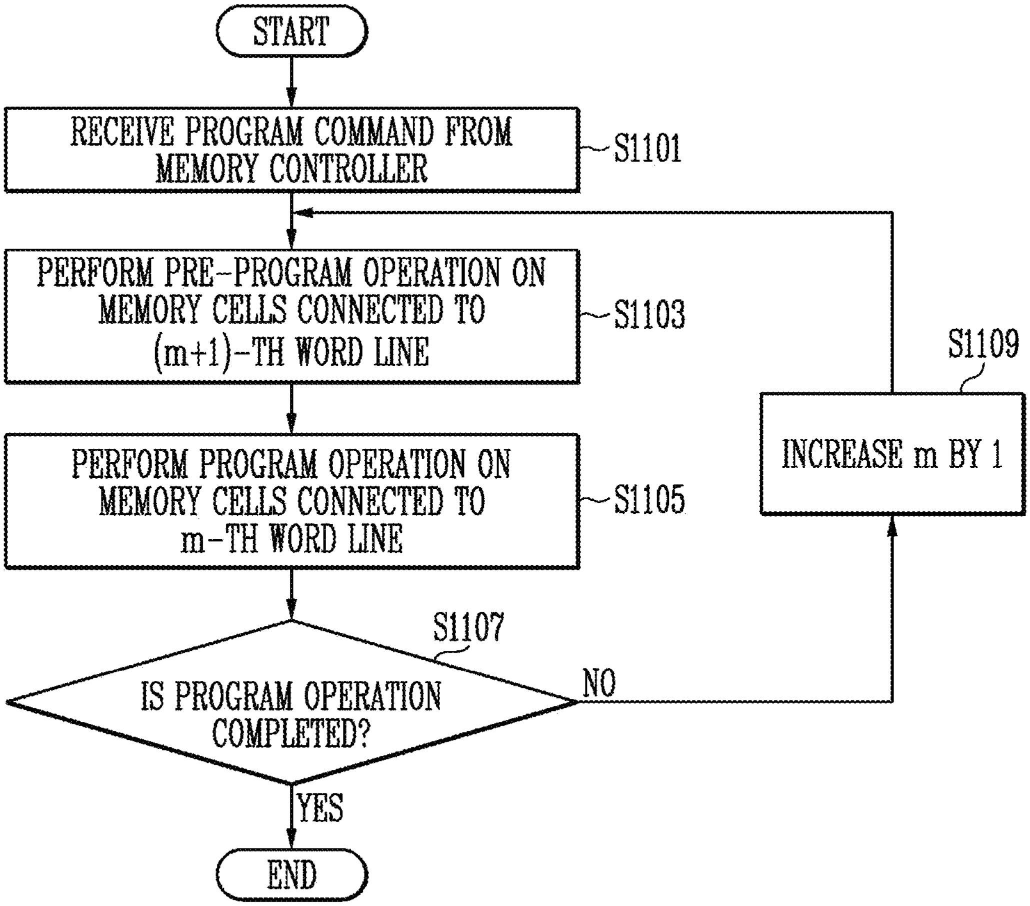
FIG. 11 is a flowchart illustrating a pre-program operation and a program operation according to an embodiment.

FIG. 11 is a flowchart illustrating a pre-program operation and a program operation according to an embodiment.

In step S1101, the memory device may receive the program command from the memory controller. The program command may be a command to perform the program operation on the memory cells that are connected to the plurality of word lines.

In step S1103, the memory device may perform the pre-program operation on the memory cells that are connected to the (m+1)-th word line in response to the program command of the memory controller. The (m+1)-th word line may be adjacent to the selected word line. The pre-program operation may be an operation that increases the threshold voltage of the over-erasure cells, among the memory cells, connected to the (m+1)-th word line, to the threshold voltage of the erasure state.

In step S1105, the memory device may perform the program operation on the memory cells that are connected to the m-th word line.

In step S1107, the memory device may determine whether the program operation corresponding to the program command that is received from the memory controller is completed. When the program operation is completed, the program operation may be ended. When the program operation is not completed, the memory device may perform the program operation on the memory cells that are connected to the next word line of the selected word line from step S1103 (S1109).

Figure 12:
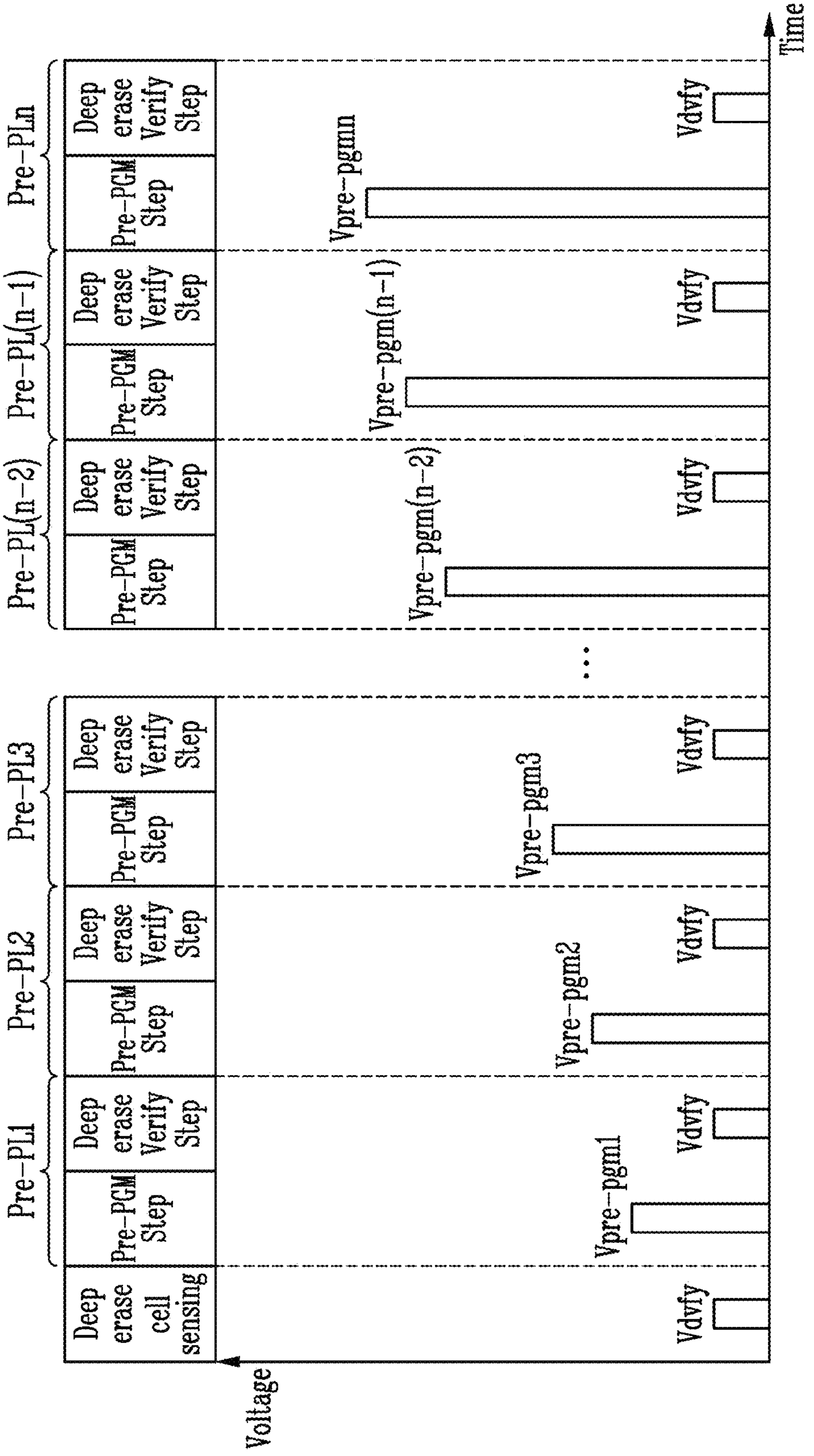
FIG. 12 is a diagram illustrating an over-erasure cell sensing operation and a pre-programming operation according to an embodiment.

FIG. 12 is a diagram illustrating an over-erasure cell sensing operation and a pre-programming operation according to an embodiment.

Before performing the program operation on the memory cell that is connected to the selected word line, the memory device may perform an over-erasure cell sensing operation 'Deep erase cell sensing' that senses the over-erasure cells, among the memory cells that are connected to the adjacent word line. After the over-erasure cell sensing operation 'Deep erase cell sensing' is completed, the memory device may perform the pre-program operation on the over-erasure cells.

In the over-erasure cell sensing operation 'Deep erase cell sensing', the memory device may apply an over-erasure verify voltage Vdvfy to the adjacent word line and may apply the pass voltage to word lines, except for the adjacent word line. A magnitude of the over-erasure verify voltage Vdvfy may be the same as a magnitude of the lowest threshold voltage, among the threshold voltages of the erasure state.

The memory device may sense a voltage or a current that is output through bit lines to which the memory cells that are connected to the adjacent word line are connected and may determine whether each of the memory cells that are connected to the adjacent word line is an over-erasure cell based on a sensed result.

In the over-erasure cell sensing operation Deep erase cell sensing, the memory device may apply a bit line pre-charge voltage to the bit line that is connected to each of the memory cells that are connected to the adjacent word line and may apply the over-erasure verify voltage Vdvfy to the adjacent word line. Among the memory cells that are connected to the adjacent word line, memory cells having a threshold voltage that is lower than the over-erasure verify voltage Vdvfy may become on-cells. Among the memory cells that are connected to the adjacent word line, memory cells having a threshold voltage that is higher than the over-erasure verify voltage Vdvfy may become off-cells. In this case, a current may flow through the bit line that is connected to the on-cell, and a current might not flow through the bit line that is connected to the off-cell. The memory device may sense a current flowing through each bit line. The memory device may determine memory cells, connected to bit lines through which the current flows, as the over-erasure cells. The memory device may determine that memory cells, connected to bit lines through which a current does not flow, are not in an over-erasure state. The pre-program operation on the memory cells that are determined as the memory cells that are not the over-erasure cells may be inhibited. Therefore, an inhibition voltage for inhibiting pre-program during the pre-program operation may be applied to the bit lines that are connected to the memory cells that are determined as the memory cells that are not the over-erasure cells.

After the over-erasure cell sensing operation 'Deep erase cell sensing' on the memory cells that are connected to the adjacent word line is completed, the memory device may perform the pre-program operation on the over-erasure cells that are connected to the adjacent word line.

Referring to FIG. 12, the pre-program operation may include a plurality of pre-program loops Pre-PL1 to Pre-PLn. The memory device may perform the plurality of pre-program loops Pre-PL1 to Pre-PLn to perform the pre-program operation that increases the threshold voltage of the over-erasure cells, among the memory cells that are connected to the adjacent word line that is adjacent to the selected word line, to the threshold voltage of the erasure state.

Each of the plurality of pre-program loops Pre-PL1 to Pre-PLn may include a pre-program voltage apply step 'Pre-PGM Step' of applying a pre-program voltage and an over-erasure verify step 'Deep erase Verify Step' of determining whether the memory cells are programmed by applying the over-erasure verify voltage Vdvfy.

In the pre-program voltage apply step 'Pre-PGM Step', a pre-program voltage apply operation of applying the pre-program voltage to the adjacent word line may be performed. The threshold voltage of the over-erasure cells may increase to the threshold voltage of the erasure state by the pre-program voltage apply operation.

In an embodiment, the pre-program voltage may be determined according to an incremental step pulse programming (ISPP) method. That is, a level of the pre-program voltage may increase stepwise by a step voltage as the pre-program loops are repeated. The application number, a voltage level, a voltage application time, and the like of the pre-program voltages that are used in each pre-program loop may be determined in various forms according to the control of the memory controller.

In the over-erasure verify step 'Deep erase Verify step', the memory device may apply the over-erasure verify voltage Vdvfy to the adjacent word line and may apply the pass voltage to the word lines, except for the adjacent word line.

The memory device may sense a voltage or a current output through the bit lines to which the memory cells that are connected to the adjacent word line are respectively connected and may determine whether the over-erasure verify step Deep erase Verify step passes or fails based on a sensed result. Specifically, when read as an off-cell in the over-erasure verify step Deep erase Verify step, the over-erasure verify operation may pass.

In an embodiment, when a first pre-program loop Pre-PL1 is performed, after a first program voltage Vpre-pgm1 is applied to the adjacent word line, the over-erasure verify voltage Vdvfy may be applied to the adjacent word line to verify a state of the over-erasure cells. Memory cells that have passed based on verification through the over-erasure verify voltage Vdvfy may be determined to have the threshold voltage of the erasure state, and the pre-program operation may be inhibited in a subsequent pre-program loop. The program inhibition voltage may be applied to bit lines that are connected to memory cells on which the pre-program operation is inhibited.

In an embodiment, the over-erasure cell sensing operation 'Deep erase cell sensing' may be omitted. When the over-erasure cell sensing operation 'Deep erase cell sensing' is omitted, the memory device might not be able to determine the over-erasure cells that are connected to the adjacent word line before performing the pre-program operation. Therefore, the memory device may perform the pre-program operation on all memory cells that are connected to the adjacent word line during the pre-program operation. Specifically, the memory device may perform the pre-program operation including the plurality of pre-program loops Pre-PL1 to Pre-PLn on all memory cells that are connected to the adjacent word line. During the pre-program operation, the memory cells that have passed in the over-erasure verify step of each pre-program loop may be determined to have the threshold voltage of the erasure-state. The pre-program operation may be inhibited in a subsequent pre-program loop of the memory cells that have passed in the over-erasure verify step. The program inhibition voltage may be applied to bit lines that are connected to the memory cells on which the pre-program operation is inhibited.

In an embodiment, the over-erasure verify step 'Deep erasure Verify Step' may be omitted during the pre-program operation. In this case, the pre-program operation might not include the plurality of pre-program loops Pre-PL1 to Pre-PLn. That is, the memory device may apply a predetermined preprogram voltage to the adjacent word line after the over-erasure cell sensing operation is completed. At this time, the level of the pre-program voltage may be preset to a level capable of increasing the threshold voltage of the over-erasure cells to the threshold voltage of the erasure state. The program inhibition voltage may be applied to bit lines that are connected to memory cells that are not the over-erasure cells.

In an embodiment, the over-erasure cell sensing operation 'Deep erase cell sensing' and the over-erasure verify step 'Deep erasure Verify Step' of the pre-program operation may be omitted. That is, the memory device may apply the pre-program voltage to the memory cells that are connected to the adjacent word line before performing the program operation on the memory cell that is connected to the selected word line. Specifically, the memory device may apply a predetermined pre-program voltage to the adjacent word line. At this time, the level of the pre-program voltage may be set to a level capable of increasing the threshold voltage of the over-erasure cells to the threshold voltage of the erasure state.

Figure 13:
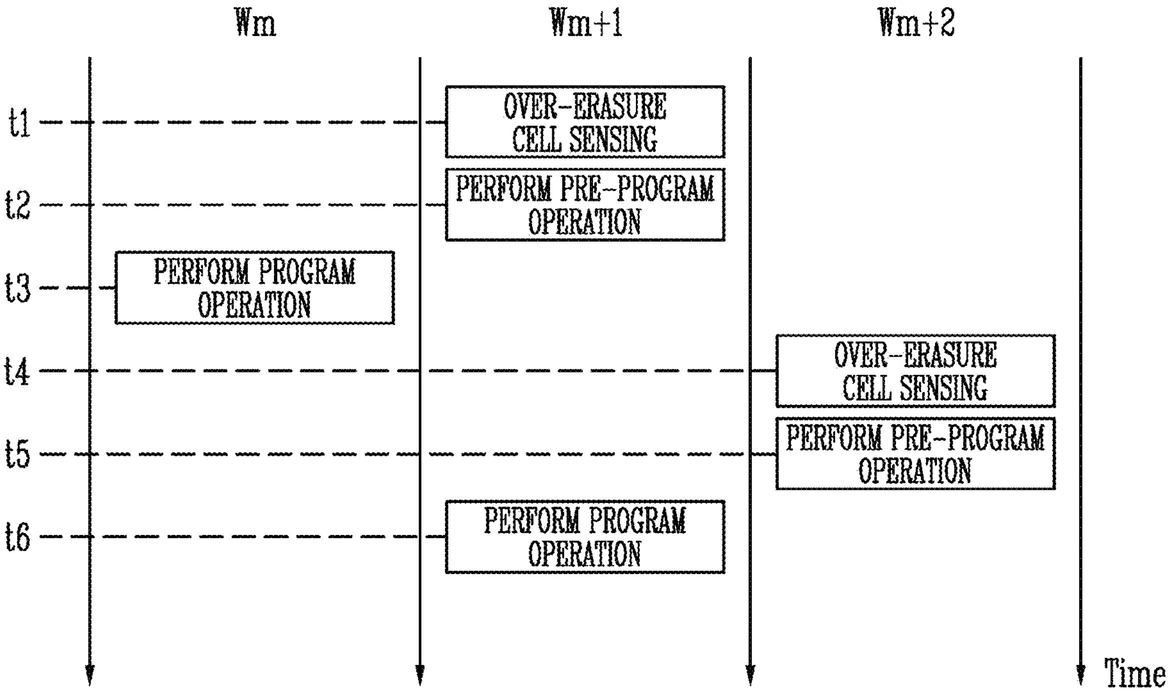
FIG. 13 is a diagram illustrating a progress order of a pre-program operation and a program operation for each word line according to an embodiment.

FIG. 13 is a diagram illustrating a progress order of a pre-program operation and a program operation for each word line according to an embodiment.

Referring to FIG. 13, the program operation may be sequentially performed from the memory cells, among the memory cells that are connected to the plurality of word lines, connected to the m-th word line Wm.

Before the program operation is performed on the memory cells that are connected to the m-th word line Wm, the over-erasure cell sensing operation of sensing the over-erasure cells, among the memory cells that are connected to the (m+1)-th word line Wm+1, of which the threshold voltage is lower than the threshold voltage of the erasure state, may be performed at t1. The (m+1)-th word line Wm+1 may be adjacent to the m-th word line Wm.

When the over-erasure cell sensing operation on the memory cells that are connected to the (m+1)-th word line Wm+1 is completed, the pre-program operation on the over-erasure cells, among the memory cells that are connected to the (m+1)-th word line Wm+1, may be performed at t2. The pre-program operation may be an operation that increases the threshold voltage of the over-erasure cells to the threshold voltage of the erasure state.

When the pre-program operation on the memory cells that are connected to the (m+1)-th word line Wm+1 is completed, the program operation may be performed on the memory cells that are connected to the m-th word line Wm at t3.

When the program operation on the memory cells that are connected to the m-th word line Wm is completed, the over-erasure cell sensing operation on memory cells that are connected to the (m+2)-th word line Wm+2 may be performed at t4. The (m+2)-th word line Wm+2 may be adjacent to the (m+1)-th word line Wm+1.

When the over-erasure cell sensing operation on the memory cells that are connected to the (m+2)-th word line Wm+2 is completed, the pre-program operation on the over-erasure cells, among the memory cells that are connected to the (m+2)-th word line Wm+2, may be performed at t5.

When the pre-program operation on the memory cells that are connected to the (m+2)-th word line Wm+2 is completed, the program operation may be performed on the memory cells that are connected to the (m+1)-th word line Wm+1 at t6.

As described with reference to FIG. 13, the memory device may perform the over-erasure cell sensing operation and the pre-program operation on the memory cells that are connected to the adjacent word line and then perform the program operation on the memory cells that are connected to the selected word line. The adjacent word line may be a word line that is adjacent to the selected word line.

Figure 14:
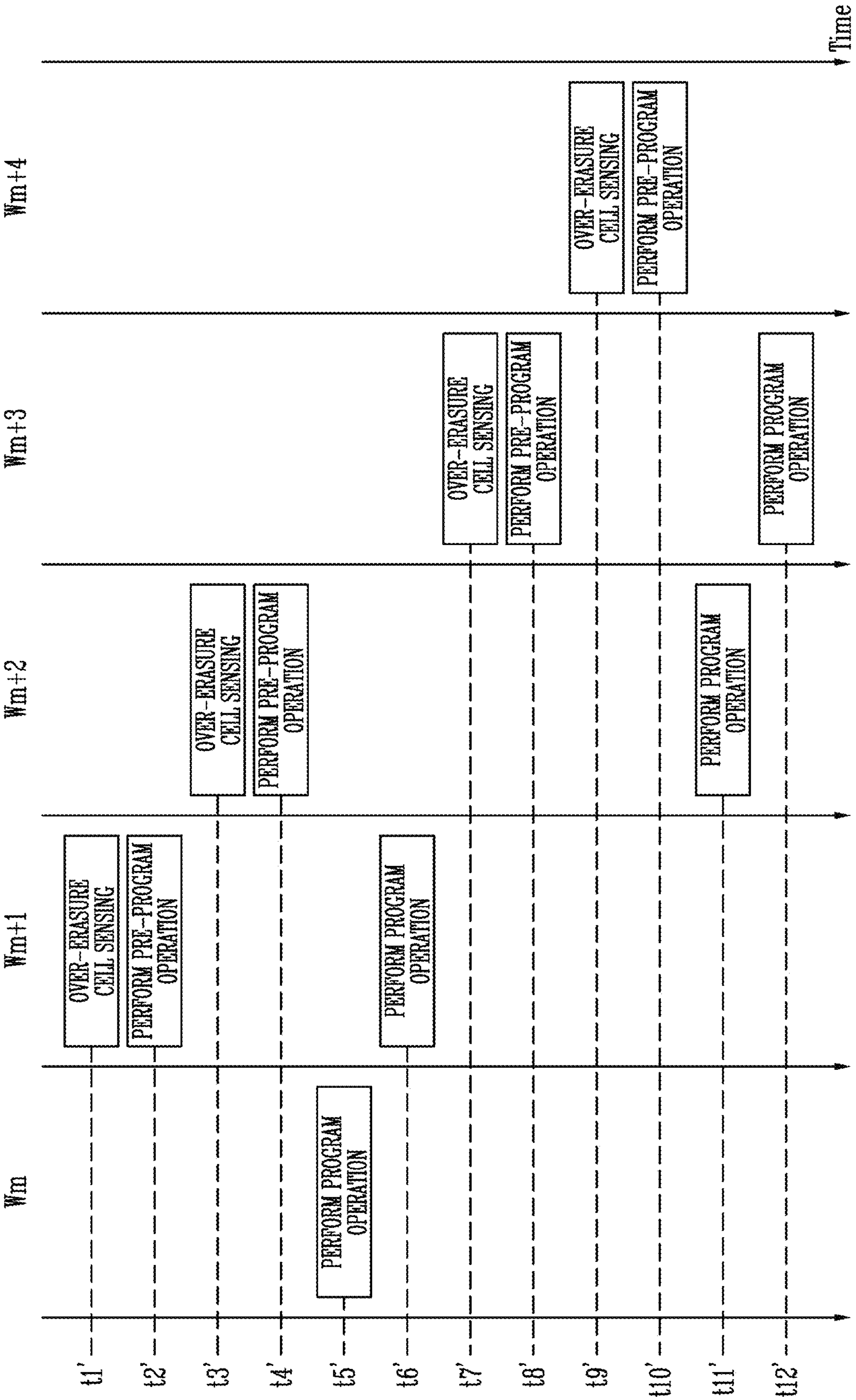
FIG. 14 is a diagram illustrating a progress order of a pre-program operation and a program operation for each word line according to another embodiment.

FIG. 14 is a diagram illustrating a progress order of a pre-program operation and a program operation for each word line according to another embodiment.

Referring to FIG. 14, the program operation may be sequentially performed from the memory cells that are connected to the m-th word line Wm among the memory cells that are connected to the plurality of word lines.

Before the program operation is performed on the memory cells that are connected to the m-th word line Wm, the over-erasure cell sensing operation of sensing the over-erasure cells, among the memory cells that are connected to the (m+1)-th word line Wm+1, of which the threshold voltage is lower than the threshold voltage of the erasure state, may be performed at t1'. The (m+1)-th word line Wm+1 may be adjacent to the m-th word line Wm.

When the over-erasure cell sensing operation on the memory cells that are connected to the (m+1)-th word line Wm+1 is completed, the pre-program operation on the over-erasure cells, among the memory cells that are connected to the (m+1)-th word line Wm+1, may be performed at t2'. The pre-program operation may be an operation that increases the threshold voltage of the over-erasure cells to the threshold voltage of the erasure state.

When the pre-program operation on the over-erasure cells among the memory cells that are connected to the (m+1)-th word line Wm+1 is completed, the over-erasure cell sensing operation of sensing the over-erasure cells, among the memory cells that are connected to the (m+2)-th word line Wm+2, may be performed at t3'. The (m+2)-th word line Wm+2 may be adjacent to the (m+1)-th word line Wm+1.

When the over-erasure cell sensing operation on the memory cells that are connected to the (m+2)-th word line Wm+2 is completed, the pre-program operation on the over-erasure cells, among the memory cells that are connected to the (m+2)-th word line Wm+2, may be performed at t4'.

When the pre-program operation on the memory cells that are connected to the (m+2)-th word line Wm+2 is completed, the program operation on the memory cells that are connected to the m-th word line Wm may be performed at t5'.

When the program operation on the memory cells that are connected to the m-th word line Wm is completed, the program operation on the memory cells that are connected to the (m+1)-th word line Wm+1 may be performed at t6'.

When the program operation on the memory cells that are connected to the (m+1)-th word line Wm+1 is completed, the over-erasure cell sensing operation on memory cells that are connected to an (m+3)-th word line Wm+3 may be performed at t7'. The (m+3)-th word line Wm+3 may be adjacent to the (m+2)-th word line Wm+2.

When the over-erasure cell sensing operation on the memory cells that are connected to the (m+3)-th word line Wm+3 is completed, the pre-program operation on the over-erasure cells, among the memory cells that are connected to the (m+3)-th word line Wm+3 may be performed at t8'.

When the pre-program operation on the memory cells that are connected to the (m+3)-th word line Wm+3 is completed, the over-erasure cell sensing operation on memory cells that are connected to an (m+4)-th word line Wm+4 may be performed at t9'. The (m+4)-th word line Wm+4 may be adjacent to the (m+3)-th word line Wm+3.

When the over-erasure cell sensing operation on the memory cells that are connected to the (m+4)-th word line Wm+4 is completed, the pre-program operation on the over-erasure cells, among the memory cells that are connected to the (m+4)-th word line Wm+4 may be performed at t10'.

When the pre-program operation on the memory cells that are connected to the (m+4)-th word line Wm+4 is completed, the program operation on the memory cells that are connected to the (m+2)-th word line Wm+2 may be performed at t11'.

When the program operation on the memory cells that are connected to the (m+2)-th word line Wm+2 is completed, the program operation on the memory cells that are connected to the (m+3)-th word line Wm+3 may be performed at t12'.

As described with reference to FIG. 14, the memory device may perform the over-erasure cell sensing operation and the pre-program operation on memory cells that are connected to the two word lines that are the most adjacent to the selected word line and then perform the program operation on the memory cells that are connected to the selected word line.

The number of word lines to which the memory cells on which the over-erasure cell sensing operation and the pre-program operation are performed before performing the program operation on the memory cells that are connected to the selected word line is not limited by the embodiments that are described with reference to FIGS. 13 and 14. In other words, the over-erasure cell sensing operation and the pre-program operation may be performed on memory cells that are connected to three or more adjacent word lines before performing the program operation on the memory cells that are connected to the selected word line.

In an embodiment, before performing the program operation on the memory cells that are connected to the selected word line, the memory device may perform the over-erasure cell sensing operation and the pre-program operation on the memory cells that are connected to all word lines, except for the selected word line, and then perform the program operation on the memory cells that are connected to the selected word line.

Figure 15:
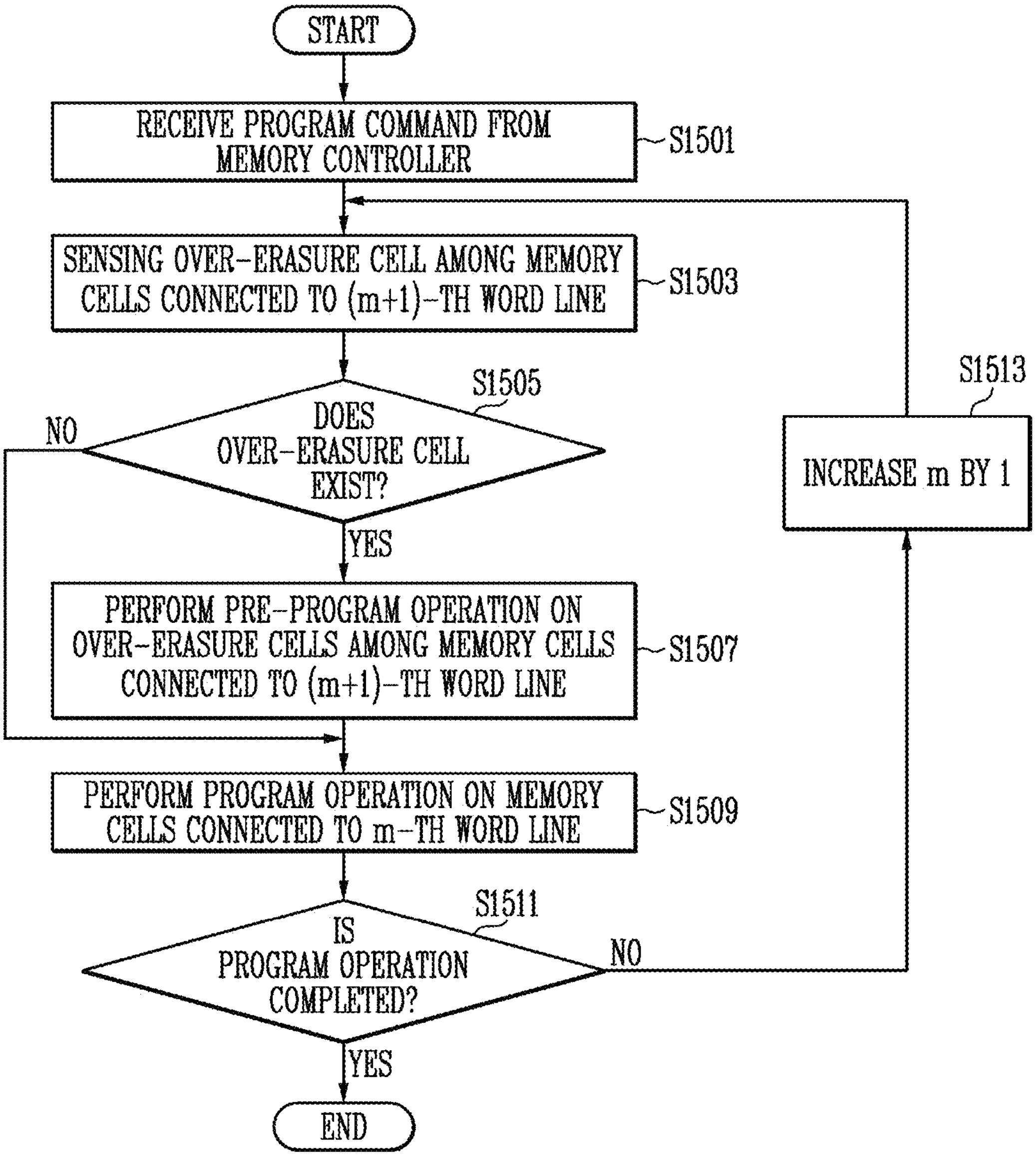
FIG. 15 is a flowchart illustrating an operation of a memory device according to an embodiment.

FIG. 15 is a flowchart illustrating an operation of a memory device according to an embodiment.

In step S1501, the memory device may receive the program command from the memory controller. The program command may be a command to perform the program operation on the memory cells that are connected to the plurality of word lines.

In step S1503, the memory device may perform the over-erasure cell sensing operation on the memory cells that are connected to the (m+1)-th word line in response to the program command of the memory controller. The (m+1)-th word line may be adjacent to the selected word line. The over-erasure cell sensing operation may be an operation that senses the over-erasure cells, among the memory cells that are connected to the (m+1)-th word line, of which the threshold voltage is lower than the threshold voltage of the erasure state.

In step S1505, the memory device may determine whether the over-erasure cell exists among the memory cells that are connected to the (m+1)-th word line.

In step S1507, when the over-erasure cell exists among the memory cells that are connected to the (m+1)-th word line, the memory device may perform the pre-program operation on the over-erasure cells that are connected to the (m+1)-th word line. The pre-program operation may be an operation that increases the threshold voltage of the memory cells, among the memory cells that are connected to the adjacent word line, having the threshold voltage of the over-erasure state, to the threshold voltage of the erasure state. When the over-erasure cells do not exist among the memory cells that are connected to the (m+1)-th word line, step S1507 may be omitted.

In step S1509, the program operation may be performed on the memory cells that are connected to the m-th word line.

In step S1511, the memory device may determine whether all program operations corresponding to the program command of the memory controller are completed.

In step S1513, when all program operations corresponding to the program command are not completed, the memory device may select the memory cells that are connected to the (m+1)-th word line as program target memory cells. After the program operation on the memory cells that are connected to the m-th word line is completed, the memory device may perform the program operation on the memory cells that are connected to the (m+1)-th word line, which is the next word line, from step S1503.

When all program operations are completed, the memory device may end the program operation corresponding to the program command of the memory controller.

Figure 16:
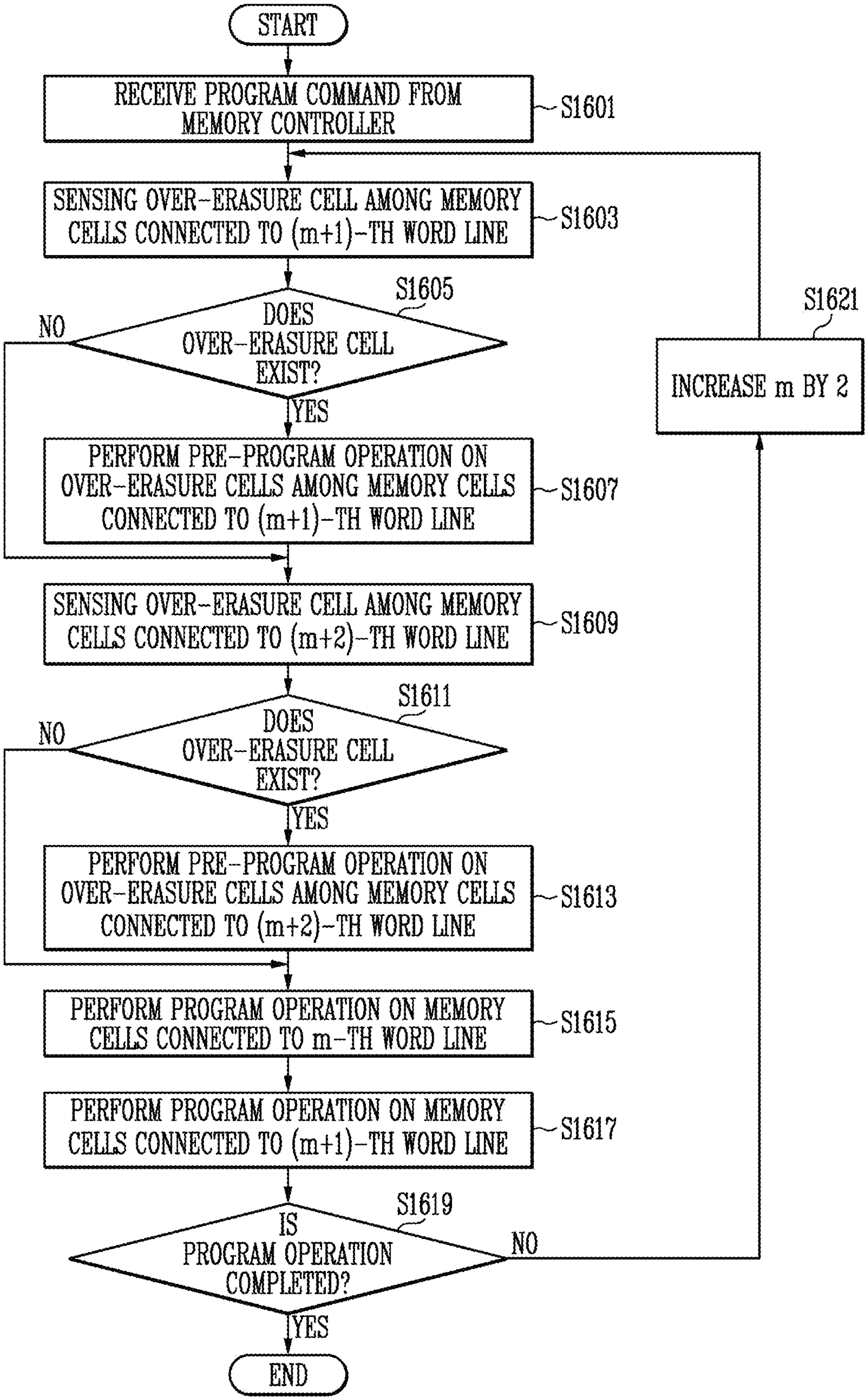
FIG. 16 is a flowchart illustrating an operation of a memory device according to another embodiment.

FIG. 16 is a flowchart illustrating an operation of a memory device according to another embodiment.

In step S1601, the memory device may receive the program command from the memory controller. The program command may be a command to perform the program operation on the memory cells that are connected to the plurality of word lines.

In step S1603, the memory device may perform the over-erasure cell sensing operation on the memory cells that are connected to the (m+1)-th word line in response to the program command of the memory controller. The (m+1)-th word line may be adjacent to the selected word line. The over-erasure cell sensing operation may be an operation that senses the over-erasure cells, among the memory cells that are connected to the (m+1)-th word line, of which the threshold voltage is lower than the threshold voltage of the erasure state.

In step S1605, the memory device may determine whether the over-erasure cell exists among the memory cells that are connected to the (m+1)-th word line.

In step S1607, when the over-erasure cell exists among the memory cells that are connected to the (m+1)-th word line, the memory device may perform the pre-program operation on the over-erasure cells that are connected to the (m+1)-th word line. The pre-program operation may be an operation that increases the threshold voltage of the memory cells, among the memory cells that are connected to the adjacent word line, having the threshold voltage of the over-erasure state, to the threshold voltage of the erasure state. When the over-erasure cells do not exist among the memory cells that are connected to the (m+1)-th word line, step S1607 may be omitted.

In step S1609, the memory device may perform the over-erasure cell sensing operation on the memory cells that are connected to the (m+2)-th word line. The (m+2)-th word line may be adjacent to the (m+1)-th word line.

In step S1611, the memory device may determine whether the over-erasure cell exists among the memory cells that are connected to the (m+2)-th word line.

In step S1613, when the over-erasure cell exists among the memory cells that are connected to the (m+2)-th word line, the memory device may perform the pre-program operation on the over-erasure cells that are connected to the (m+2)-th word line. When the over-erasure cells do not exist among the memory cells that are connected to the (m+2)-th word line, step S1613 may be omitted.

In step S1615, the program operation may be performed on the memory cells that are connected to the m-th word line.

In step S1617, the program operation may be performed on the memory cells that are connected to the (m+1)-th word line.

In step S1619, the memory device may determine whether all program operations corresponding to the program command of the memory controller are completed.

In step S1621, when all program operations corresponding to the program command are not completed, the memory device may select the memory cells that are connected to the (m+2)-th word line as program target memory cells. That is, since the program operation on the memory cells that are connected to the m-th word line and the (m+1)-th word line that is adjacent to the m-th word line is completed, the memory device may select the memory cells that are connected to the (m+2)-th word line that is adjacent to the (m+1)-th word line as program target memory cells. The memory device may perform the program operation on the memory cells that are connected to the (m+2)-th word line from step S1603.

When all program operations are completed, the memory device may end the program operation corresponding to the program command of the memory controller.

Figure 17:
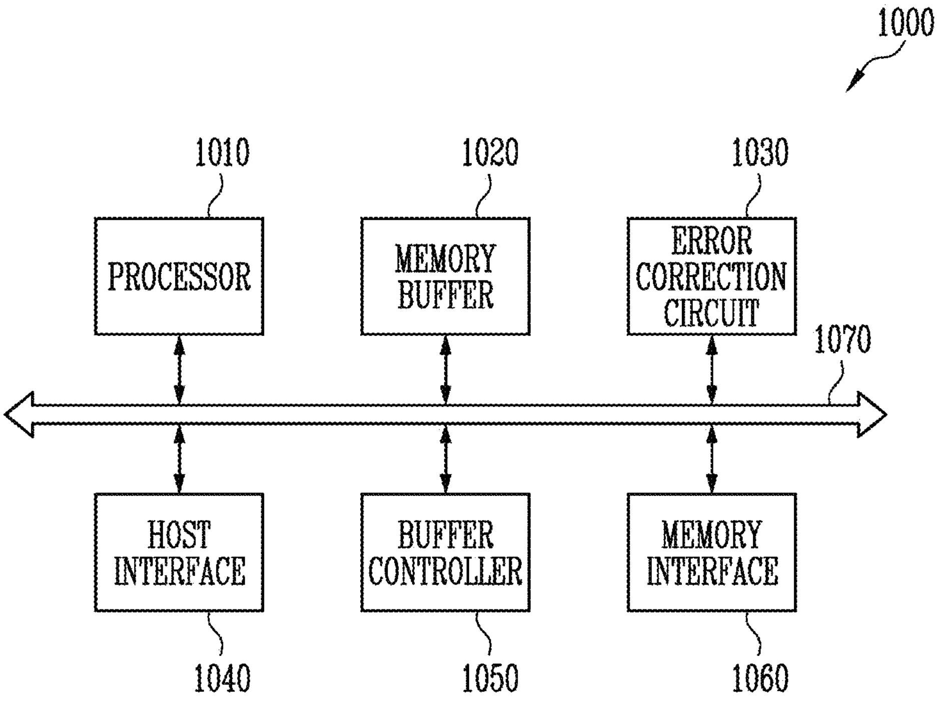
FIG. 17 is a diagram illustrating another embodiment of a memory controller of FIG. 1.

FIG. 17 is a diagram illustrating another embodiment of the memory controller of FIG. 1.

Referring to FIG. 17, the memory controller 1000 may be connected to a host and the memory device. The memory controller 1000 may be configured to access the memory device in response to a request from the host. For example, the memory controller 1000 may be configured to control the write, read, erase, and background operations of the memory device. The memory controller 1000 may be configured to provide an interface between the memory device and the host. The memory controller 1000 may be configured to drive firmware for controlling the memory device.

The memory controller 1000 may include a processor 1010, a memory buffer 1020, an error correction circuit (ECC) 1030, a host interface 1040, a buffer control circuit 1050, a memory interface 1060, and a bus 1070.

The bus 1070 may be configured to provide a channel between components of the memory controller 1000.

The processor 1010 may control an overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of an FTL. The processor 1010 may convert an LBA provided by the host into a PBA through the FTL. The FTL may receive the LBA using a mapping table and convert the LBA into the PBA. An address mapping method of the flash translation layer may include various methods according to a mapping unit. A representative address mapping method may include a page mapping method, a block mapping method, and a hybrid mapping method.

The processor 1010 may be configured to randomize data received from the host. For example, the processor 1010 may randomize the data that is received from the host using a randomizing seed. The randomized data may be provided to the memory device as data to be stored and may be programmed to the memory cell array.

The processor 1010 may be configured to de-randomize data that is received from the memory device during the read operation. For example, the processor 1010 may de-randomize the data that is received from the memory device using a de-randomizing seed. The de-randomized data may be output to the host.

As an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands that are executed by the processor 1010. The memory buffer 1020 may store data that is processed by the processor 1010. The memory buffer 1020 may include a static RAM (SRAM) or a dynamic RAM (DRAM).

The ECC 1030 may perform error correction. The ECC 1030 may perform error correction encoding (ECC encoding) based on data to be written to the memory device through memory interface 1060. The error correction encoded data may be transferred to the memory device through the memory interface 1060. The ECC 1030 may perform error correction decoding (ECC decoding) on the data that is received from the memory device through the memory interface 1060. For example, the ECC 1030 may be included in the memory interface 1060 as a component of the memory interface 1060.

The host interface 1040 may be configured to communicate with an external host under control of the processor 1010. The host interface 1040 may be configured to perform communication by using at least one of various communication methods, such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 may be configured to control the memory buffer 1020 under the control of the processor 1010.

The memory interface 1060 may be configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 by using codes. The processor 1010 may load the codes from a nonvolatile memory device (for example, a read only memory) that is configured to be inside of the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000, and the control bus may be configured to transmit control information, such as a command and an address, within the memory controller 1000. The data bus and the control bus may be separated from each other and might not interfere with each other or affect each other. The data bus may be connected to the host interface 1040, the buffer controller 1050, the ECC 1030, and the memory interface 1060. The control bus may be connected to the host interface 1040, the processor 1010, the buffer controller 1050, the memory buffer 1020, and the memory interface 1060.

Figure 18:
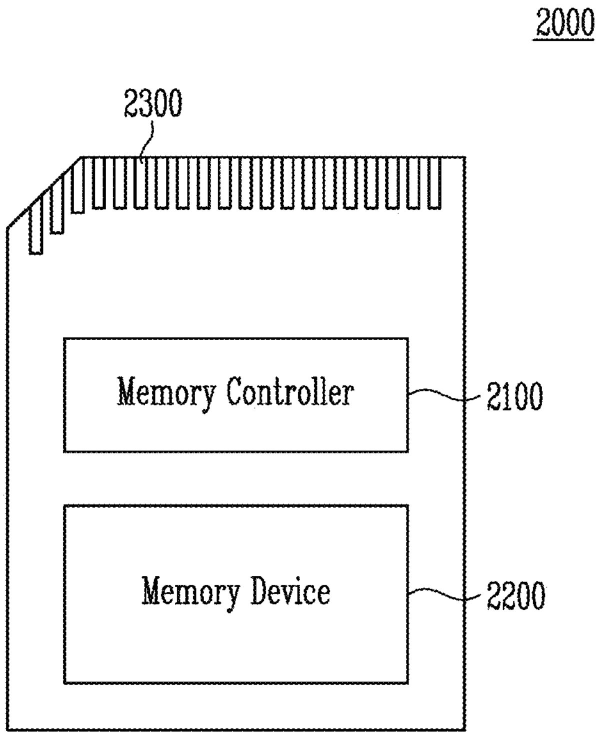
FIG. 18 is a block diagram illustrating a memory card system to which a storage device according to an embodiment of the present disclosure is applied.

FIG. 18 is a block diagram illustrating a memory card system to which a storage device according to an embodiment of the present disclosure is applied.

Referring to FIG. 18, the memory card system 2000 includes a memory controller 2100, a memory device 2200, and a connector 2300.

The memory controller 2100 may be connected to the memory device 2200. The memory controller 2100 may be configured to access the memory device 2200. For example, the memory controller 2100 may be configured to control read, write, erase, and background operations of the memory device 2200. The memory controller 2100 may be configured to provide an interface between the memory device 2200 and a host. The memory controller 2100 may be configured to drive firmware for controlling the memory device 2200. The memory controller 2100 may be implemented identically to the memory controller 200, described with reference to FIG. 1.

For example, the memory controller 2100 may include components, such as a random access memory (RAM), a processor, a host interface, a memory interface, and an ECC.

The memory controller 2100 may communicate with an external device through the connector 2300. The memory controller 2100 may communicate with an external device (for example, the host) according to a specific communication standard. For example, the memory controller 2100 may be configured to communicate with an external device through at least one of various communication standards, such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards as described above.

For example, the memory device 2200 may be configured of various nonvolatile memory elements, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 19:
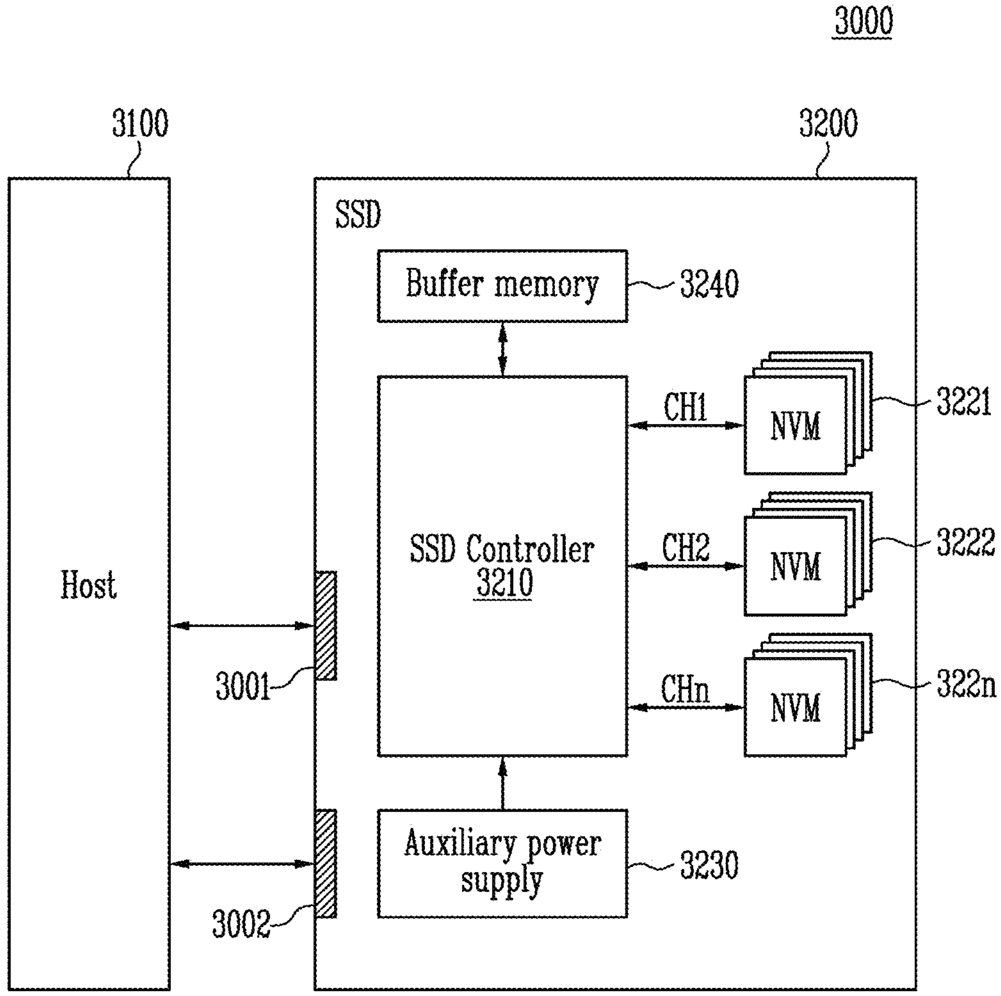
FIG. 19 is a block diagram illustrating a solid state drive (SSD) system to which a storage device according to an embodiment of the present disclosure is applied.

FIG. 19 is a block diagram illustrating a solid state drive (SSD) system to which a storage device according to an embodiment of the present disclosure is applied.

Referring to FIG. 19, the SSD system 3000 may include a host 3100 and an SSD 3200. The SSD 3200 may exchange a signal with the host 3100 through a signal connector 3001 and may receive power PWR through a power connector 3002. The SSD 3200 may include an SSD controller 3210, a plurality of flash memories (NVM) 3221 to **322*n*, an auxiliary power device 3230, and a buffer memory 3240**.

According to an embodiment of the present disclosure, the SSD controller 3210 may perform the function of the memory controller 200, described with reference to FIG. 1.

The SSD controller 3210 may control the plurality of flash memories 3221 to **322*n* in response to the signal that is received from the host 3100. For example, the signal may be signals based on an interface between the host 3100 and the SSD 3200**. For example, the signal may be a signal that is defined by at least one of the following interfaces: a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 may be connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside of the SSD 3200. For example, the auxiliary power device 3230 may be positioned on a main board and may provide auxiliary power to the SSD 3200.

The buffer memory 3240 may operate as a buffer memory of the SSD 3200. For example, the buffer memory 3240 may temporarily store data that is received from the host 3100 or data that is received from the plurality of flash memories 3221 to 322*n* or may temporarily store metadata (for example, a mapping table) of the flash memories 3221 to 322*n*. The buffer memory 3240 may include a volatile memory, such as a DRAM, an SDRAM, a DDR SDRAM, an LPDDR SDRAM, and a GRAM, or a nonvolatile memory, such as an FRAM, a ReRAM, an STT-MRAM, and a PRAM.

Figure 20:
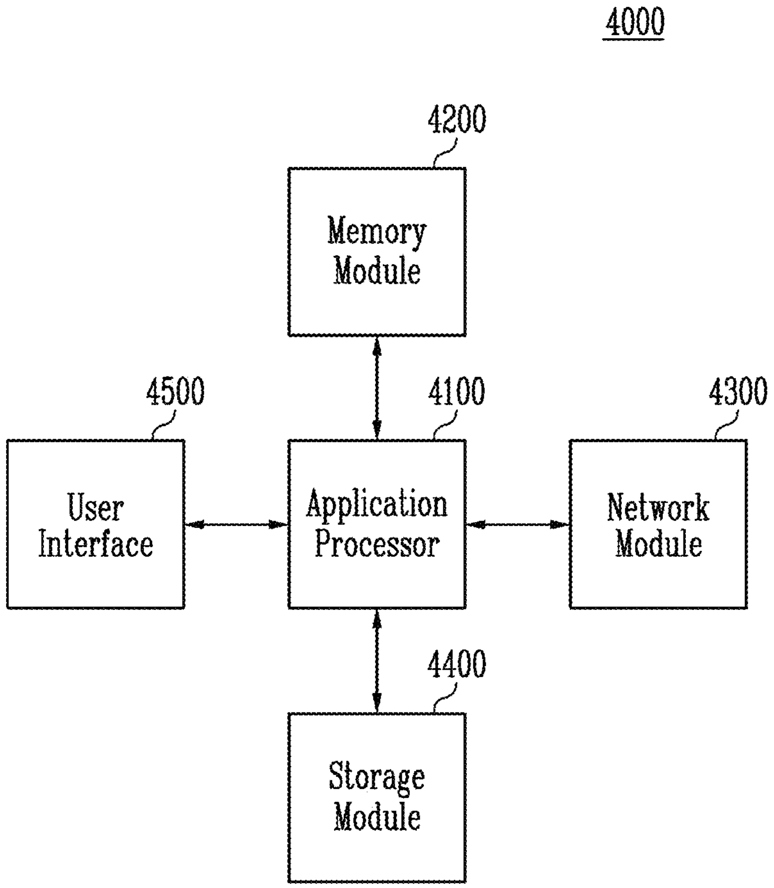
FIG. 20 is a block diagram illustrating a user system to which a storage device according to an embodiment of the present disclosure is applied.

FIG. 20 is a block diagram illustrating a user system to which a storage device according to an embodiment of the present disclosure is applied.

Referring to FIG. 20, the user system 4000 may include an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components that are included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory, such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and may be provided as one semiconductor package.

The network module 4300 may communicate with external devices. For example, the network module 4300 may support wireless communication, such as code division multiple access (CDMA), global system for mobile communications (GSM), wideband CDMA (WCDMA), CDMA-2000, time division multiple access (TDMA), long term evolution, WiMax, WLAN, UWB, Bluetooth, and Wi-Fi. For example, the network module 4300 may be included in the application processor 4100.

The storage module 4400 may store data. For example, the storage module 4400 may store data that is received from the application processor 4100. Alternatively, the storage module 4400 may transmit data that is stored in the storage module 4400 to the application processor 4100. For example, the storage module 4400 may be implemented as a nonvolatile semiconductor memory element, such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100, described with reference to FIG. 1. The storage module 4400 may operate identically to the storage device 50, described with reference to FIG. 1.

The user interface 4500 may include interfaces for inputting data or an instruction to the application processor 4100 or for outputting data to an external device. For example, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces, such as a liquid crystal display (LCD), an organic light emitting diode (OLED) display device, an active matrix OLED (AMOLED) display device, an LED, a speaker, and a monitor.

What is claimed is:

1. A memory system comprising:

a memory device including a plurality of memory cells connected to each word line, among a plurality of word lines; and a memory controller configured to generate a program command and control the memory device to perform a program operation, wherein the memory device comprises:

a peripheral circuit configured to perform the program operation on selected memory cells that are connected to a selected word line, among the plurality of word lines, in response to receiving the program command; and a control logic configured to control the peripheral circuit to:

perform an over-erasure cell sensing operation on adjacent memory cells that are connected to an adjacent word line which is adjacent to the selected word line, based on the program command, before performing a pre-program operation on over-erasure cells having a threshold voltage of an over-erasure state that is lower than a threshold voltage of an erasure state, and perform the program operation on the selected memory cells after performing the pre-program operation on the over-erasure cells whose threshold voltage is increased to the threshold voltage of the erasure state, wherein the control logic determines memory cells that have threshold voltages that are lower than an over-erasure verify voltage, based on threshold voltages of the adjacent memory cells, as the over-erasure cells among the adjacent memory cells during the over-erasure cell sensing operation.

2. The memory system of claim 1, wherein the adjacent memory cells are respectively connected to a plurality of bit lines, wherein the control logic is configured, in the pre-program operation, to control the peripheral circuit to apply a pre-program voltage to the adjacent word line, apply a ground voltage to bit lines, among the plurality of bit lines, connected to the over-erasure cells, and apply a power voltage to bit lines, among the plurality of bit lines, connected to memory cells other than the over-erasure cells, and wherein the pre-program voltage is set to a level capable of increasing the threshold voltage of the memory cells having the threshold voltage of the over-erasure state to the threshold voltage of the erasure state.

3. The memory system of claim 1, wherein the pre-program operation includes a plurality of program loops, wherein each of the plurality of program loops includes a step of applying a pre-program voltage to the adjacent memory cells and a verify step of checking whether the adjacent memory cells are programmed to the erasure state, and wherein the pre-program voltage increases by a step voltage whenever a program loop increases.

4. The memory system of claim 3, wherein the control logic is configured to control the peripheral circuit to perform the verify step by using the over-erasure verify voltage in the verify step, and wherein the over-erasure verify voltage has the same voltage level as a lowest threshold voltage, among the threshold voltages of the erasure state.

5. The memory system of claim 1, wherein the over-erasure verify voltage has the same voltage level as a lowest threshold voltage, among the threshold voltages of the erasure state.

6. The memory system of claim 1, wherein the control logic is configured to control the peripheral circuit to perform the program operation on memory cells that are connected to an m-th word line that is the selected word line after performing the pre-program operation on memory cells that are connected to an (m+1)-th word line, which is the adjacent word line, and to perform the program operation on memory cells that are connected to the (m+1)-th word line after performing the pre-program operation on memory cells that are connected to an (m+2)-th word line that is adjacent to the (m+1)-th word line.

7. The memory system of claim 1, wherein the control logic controls the peripheral circuit to perform the program operation on memory cells that are connected to an m-th word line which is the selected word line and an (m+1)-th word line which is the adjacent word line after performing the pre-program operation on memory cells that are connected to the (m+1)-th word line and an (m+2)-th word line that is adjacent to the (m+1)-th word line, and perform the program operation on memory cells that are connected to the (m+2)-th word line and an (m+3)-th word line that is adjacent to the (m+2)-th word line after performing the pre-program operation on memory cells that are connected to the (m+3)-th word line and an (m+4)-th word line that is adjacent to the (m+3)-th word line, when the program operation on the memory cells that are connected to the (m+1)-th word line is completed.

8. The memory system of claim 1, wherein the plurality of memory cells are included in a memory block, and wherein the control logic is configured to perform the program operation on the selected memory cells after performing the pre-program operation on memory cells, among the plurality of memory cells that are included in the memory block, connected to all word lines other than the selected word line.

9. The memory system of claim 1, wherein the plurality of memory cells includes memory cells that are programmed to any one state, among a plurality of program states.

10. A method of operating a memory system comprising a memory device including a plurality of memory cells connected to each word line, among a plurality of word lines, and a memory controller controlling the memory device to perform a program operation on selected memory cells that are connected to selected word line, among the plurality of word lines, the method comprising:

receiving a program command which indicates performing the program operation;

sensing threshold voltages of adjacent memory cells that are connected to an adjacent word line which is adjacent to the selected word line, based on the program command;

determining memory cells that have threshold voltages that are lower than an over-erasure verify voltage as over-erasure cells among the adjacent memory cells, wherein the over-erasure cells have a threshold voltage of an over-erasure state that is lower than a threshold voltage of an erasure state;

performing a pre-program operation that programs the over-erasure cells to the erasure state; and performing the program operation on the selected memory cells in response to the program command.

11. The method of claim 10, wherein the over-erasure verify voltage has the same voltage level as a lowest threshold voltage, among the threshold voltages of the erasure state.

12. The method of claim 10, wherein performing the pre-program operation comprises a pre-program voltage apply step of applying a pre-program voltage to the adjacent memory cells and a verify step of checking whether the adjacent memory cells are programmed to the erasure state, wherein the pre-program operation includes a plurality of program loops, each including the pre-program voltage apply step and the verify step, and wherein the pre-program voltage increases by a step voltage whenever a program loop increases.

13. The method of claim 12, wherein the verify step comprises checking whether the adjacent memory cells are programmed to the erasure state by using the over-erasure verify voltage, and wherein the over-erasure verify voltage has the same voltage level as a lowest threshold voltage, among the threshold voltages of the erasure state.

* * * * *